US011139329B2

(12) United States Patent
Nishikido et al.

(10) Patent No.: US 11,139,329 B2
(45) Date of Patent: Oct. 5, 2021

(54) SOLID-STATE IMAGING ELEMENT, MANUFACTURING METHOD, AND ELECTRONIC APPARATUS

(71) Applicant: SONY CORPORATION, Tokyo (JP)

(72) Inventors: Kenju Nishikido, Kumamoto (JP); Takekazu Shinohara, Kumamoto (JP); Shinichiro Noudo, Kumamoto (JP); Misato Kondo, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 86 days.

(21) Appl. No.: 16/316,172

(22) PCT Filed: Jun. 30, 2017

(86) PCT No.: PCT/JP2017/024102
§ 371 (c)(1),
(2) Date: Jan. 8, 2019

(87) PCT Pub. No.: WO2018/012314
PCT Pub. Date: Jan. 18, 2018

(65) Prior Publication Data
US 2021/0183934 A1 Jun. 17, 2021

(30) Foreign Application Priority Data
Jul. 15, 2016 (JP) .............................. JP2016-140380

(51) Int. Cl.
*H01L 27/146* (2006.01)

(52) U.S. Cl.
CPC .. *H01L 27/14625* (2013.01); *H01L 27/14603* (2013.01); *H01L 27/14636* (2013.01);
(Continued)

(58) Field of Classification Search
CPC ....... H01L 27/14643–14663; H01L 27/14601; H01L 27/14603; H01L 27/14625;
(Continued)

(56) References Cited

U.S. PATENT DOCUMENTS

2005/0090035 A1 4/2005 Kim
2009/0124073 A1* 5/2009 Liu .................. H01L 24/05
438/612
(Continued)

FOREIGN PATENT DOCUMENTS

JP 2005-129952 5/2005
JP 2009-290229 12/2009
(Continued)

OTHER PUBLICATIONS

International Search Report prepared by the Japan Patent Office dated Aug. 29, 2017, for International Application No. PCT/JP2017/024102.

*Primary Examiner* — Scott B Geyer
(74) *Attorney, Agent, or Firm* — Sheridan Ross P.C.

(57) ABSTRACT

The present disclosure relates to a solid-state imaging element, a manufacturing method, and an electronic apparatus, in which irregular reflection of light inside a solid-state imaging element package can be suppressed.
In the solid-state imaging element, a plurality of pixels is planarly arranged, a connection portion utilized for connection to the outside is provided on a more outer side than an imaging region, and an open portion that is opened up to the connection portion from a light incident surface side of the imaging region where light is incident is formed. Additionally, a plurality of protruding portions periodically arranged is formed on a counterbore surface that is a surface inside the open portion excluding the connection portion. The present
(Continued)

technology can be applied to, for example, a back-illuminated type or layered CMOS image sensor.

8 Claims, 30 Drawing Sheets

(52) U.S. Cl.
CPC .. *H01L 27/14685* (2013.01); *H01L 27/14643* (2013.01); *H01L 2224/04042* (2013.01)

(58) Field of Classification Search
CPC ......... H01L 27/14627; H01L 27/14629; H01L 27/14636; H01L 2224/04042; H01L 2224/48151–48265; H01L 24/42; H01L 2224/42–49505; H01L 2224/85–85986
See application file for complete search history.

(56) References Cited

U.S. PATENT DOCUMENTS

| | | | |
|---|---|---|---|
| 2010/0044816 A1* | 2/2010 | Minamio | H01L 27/14627 257/432 |
| 2010/0109006 A1 | 5/2010 | Kobayashi et al. | |
| 2011/0115002 A1* | 5/2011 | Tai | H01L 24/05 257/291 |
| 2012/0001286 A1 | 1/2012 | Yoon | |
| 2012/0086094 A1 | 4/2012 | Watanabe | |
| 2012/0217604 A1* | 8/2012 | Shibuki | H01L 27/1464 257/443 |
| 2014/0054739 A1 | 2/2014 | Kameshima | |
| 2015/0021729 A1* | 1/2015 | Maehara | H01L 27/14632 257/432 |
| 2015/0035104 A1 | 2/2015 | Horikoshi | |
| 2017/0040369 A1* | 2/2017 | Shimizu | H01L 27/14623 |

FOREIGN PATENT DOCUMENTS

| | | |
|---|---|---|
| JP | 2010-109137 | 5/2010 |
| JP | 2012-084693 | 4/2012 |
| JP | 2014-044989 | 3/2014 |
| JP | 2015-029011 | 2/2015 |

\* cited by examiner

SOLID-STATE IMAGING ELEMENT, MANUFACTURING METHOD, AND ELECTRONIC APPARATUS

CROSS REFERENCE TO RELATED APPLICATIONS

This application is a national stage application under 35 U.S.C. 371 and claims the benefit of PCT Application No. PCT/JP2017/024102 having an international filing date of 30 Jun. 2017, which designated the United States, which PCT application claimed the benefit of Japanese Patent Application No. 2016-140380 filed 15 Jul. 2016, the entire disclosures of each of which are incorporated herein by reference.

TECHNICAL FIELD

The present disclosure relates to a solid-state imaging element, a manufacturing method, and an electronic apparatus, and particularly relates to a solid-state imaging element, a manufacturing method, and an electronic apparatus, in which irregular reflection of light inside a solid-state imaging element package can be suppressed.

BACKGROUND ART

In the related art, a solid-state imaging element such as a complementary metal oxide semiconductor (CMOS) image sensor may be increased, for example, in height due to function increase, or the like. This results in a structure in which a metal pad utilized for connection between the solid-state imaging element and the outside is arranged at a deep position of the solid-state imaging element.

Therefore, a wire bonding ball provided at a tip portion of a bonding wire connected to the metal pad sometimes enters an open portion formed to open the metal pad. In this case, it is necessary to reduce a diameter of the wire bonding ball or enlarge the open portion so as to be able to insert a shear tool in order to perform a shear test to measure bond strength between the metal pad and the wire bonding ball.

Additionally, the applicant of the present application proposes a back-illuminated solid-state imaging device in which a highly-accurate optical component and the like can be manufactured by suppressing an influence of a level difference caused by an open portion used for electrode extraction formed in course of a manufacturing process (refer to Patent Document 1, for example).

CITATION LIST

Patent Document

Patent Document 1: Japanese Patent Application Laid-Open No. 2009-290229

SUMMARY OF THE INVENTION

Problems to be Solved by the Invention

By the way, there is a concern about occurrence of irregular reflection of light, such as secondary reflection of light reflected at a surface inside an open portion, in a structure in which an open portion is enlarged so as to be able to insert a shear tool as described above. Additionally, when such light enters a pixel, image quality is degraded.

The present disclosure is made in view of such situations, and is directed to achieving suppression of irregular reflection of light inside a solid-state imaging element package.

Solutions to Problems

A solid-state imaging element according to an aspect of the present disclosure includes: an imaging region where a plurality of pixels is planarly arranged and imaging is performed by receiving incident light; a connection portion provided on a more outer side than the imaging region is and utilized for connection to the outside; an open portion that is opened up to the connection portion from a light incident surface side of the imaging region on which light is incident; and a plurality of protruding portions formed on a counterbore surface and periodically arranged, the counterbore surface being a surface inside the open portion excluding the connection portion, and also being a surface facing at least the light incident surface side at a position lower than a layer provided in the imaging region or in a peripheral region of the imaging region and containing an organic substance.

A manufacturing method according to an aspect of the present disclosure is a manufacturing method for a solid-state imaging element that includes: an imaging region where a plurality of pixels is planarly arranged and imaging is performed by receiving incident light; a connection portion provided on a more outer side than the imaging region is and utilized for connection to the outside; an open portion that is opened up to the connection portion from a light incident surface side of the imaging region on which light is incident; and a plurality of protruding portions formed on a counterbore surface and periodically arranged, the counterbore surface being a surface inside the open portion excluding the connection portion, and also being a surface facing at least the light incident surface side at a position lower than a layer provided in the imaging region or in a peripheral region of the imaging region and containing an organic substance, and the manufacturing method includes:

forming the protruding portions by transferring shapes of lenses by etching, at the time of excavating the open portion, a lens layer where the lenses to condense light are formed for the respective pixels in the imaging region located at a position higher than a surface where the protruding portions are formed.

An electronic apparatus according to an aspect of the present disclosure includes a solid-state imaging element including:

an imaging region where a plurality of pixels is planarly arranged and imaging is performed by receiving incident light; a connection portion provided on a more outer side than the imaging region is and utilized for connection to the outside; and a plurality of protruding portions formed on a counterbore surface and periodically arranged, the counterbore surface being a surface inside the open portion excluding the connection portion, and also being a surface facing at least a light incident surface side at a position lower than a layer provided in the imaging region or in a peripheral region of the imaging region and containing an organic substance.

According to an aspect of the present disclosure, a plurality of pixels is planarly arranged, a connection portion that is utilized for connection to the outside and provided on a more outer side than an imaging region where imaging is performed by receiving incident light, and an open portion that is opened up to the connection portion from a light incident surface side of the imaging region on which light is incident. Additionally, a plurality of protruding portions periodically arranged is formed on a counterbore surface that is a surface inside the open portion excluding the connection portion and also is a surface facing at least the light incident surface side at a position lower than a layer provided in the imaging region or in a peripheral region of the imaging region and containing an organic substance.

Effects of the Invention

According to one aspect of the present disclosure, irregular reflection of light inside the solid-state imaging element package can be suppressed.

MODE FOR CARRYING OUT THE INVENTION

In the following, a specific embodiment to which the present technology is applied will be described in detail with reference to the drawings.

Figure 1:
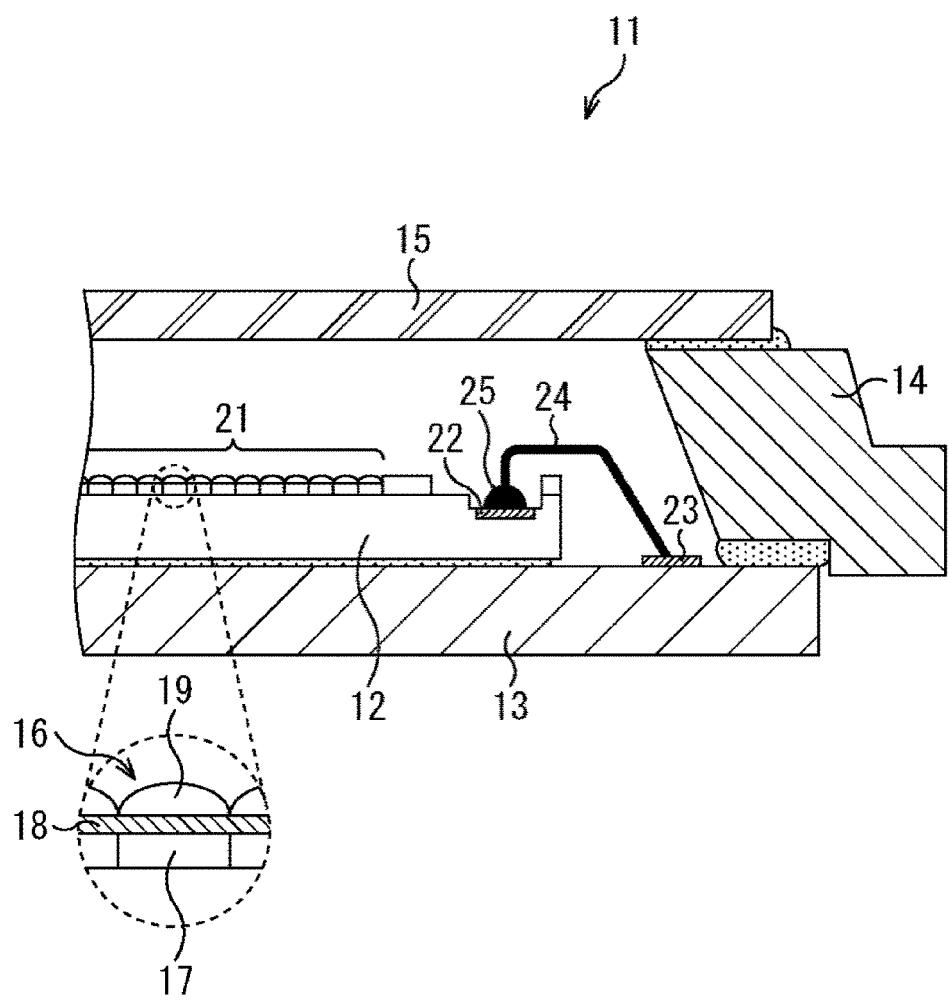
FIG. 1 is a diagram illustrating a cross-sectional exemplary structure of one embodiment of a solid-state imaging element package to which the present technology is applied.

FIG. 1 is a diagram illustrating a cross-sectional exemplary structure of the embodiment of a solid-state imaging element package to which the present technology is applied.

As illustrated in FIG. 1, a solid-state imaging element package 11 has a structure in which an imaging element 12 is sealed by a protective glass 15 being fixed to a frame 14 having a shape that surrounds an outer periphery of an interposer substrate 13 on which an imaging element 12 is placed. For example, the imaging element 12 and the frame 14 are fixed to the interposer substrate 13 with an adhesive, and also the protective glass 15 is fixed to the frame 14 with an adhesive. Additionally, a plate to prevent flare may be arranged on an upper side of the protective glass 15.

The imaging element 12 is provided with an imaging region 21 where a plurality of pixels 16 that receives light condensed via an optical system (not illustrated) is planarly arranged, and imaging is performed by receiving light incident on the imaging region 21. Furthermore, the imaging region 21 has a structure obtained by layering: a photodiode 17 that performs photoelectric conversion per pixel 16; a filter 18 (layer containing an organic substance) that transmits light of a predetermined wavelength band; an on-chip lens 19 that collects light; and the like. Meanwhile, as the imaging element 12, a back-illuminated CMOS image sensor that emits light from a back side of a semiconductor substrate, a layered CMOS image sensor obtained by layering a semiconductor substrate formed with pixels 16 and a semiconductor substrate formed with a circuit, or the like is used.

Additionally, in the imaging element 12, a plurality of metal pads 22 electrically connected to the pixels 16 provided in the imaging region 21 is provided on an edge portion located on a more outer side than the imaging region 21 is, and the metal pads 22 are utilized for connection to the outside of the imaging element 12. On the other hand, the interposer substrate 13 is provided with a plurality of metal pads 23 in a manner corresponding to the respective plurality of metal pads 22 provided in the imaging element 12. Additionally, a pixel signal can be output from the imaging element 12 to the outside via the interposer substrate 13 by connecting a metal pad 22 and a metal pad 23 to a bonding wire 24.

For example, to bond the metal pad 22 to the bonding wire 24, it is possible to use a bonding method in which a ball is formed by electrically discharging a tip of the bonding wire 24 to melt a metal thereof, and the ball is utilized. Consequently, a wire bonding ball 25 is formed at a connection portion between the metal pad 22 and the bonding wire 24, and bond strength can be increased by increasing the bonded area.

Meanwhile, in recent years, there is a case where height increase of the imaging element 12 is required due to function increase. For example, a so-called image phase difference detection technology in which a phase difference detection pixel to detect defocus with respect to a subject is embedded in the imaging element 12 is productized. Additionally, it is possible to adjust a focal point of the on-chip lens 19 to a position higher than a surface of a photodiode 17 in order to improve autofocus accuracy by means of the phase difference detection, and increase in a height of an entire light condensing structure is required. Therefore, a pad open portion to open the metal pad 22 from a light incident surface side of the imaging element 12 tends to be formed deep.

Figure 2:
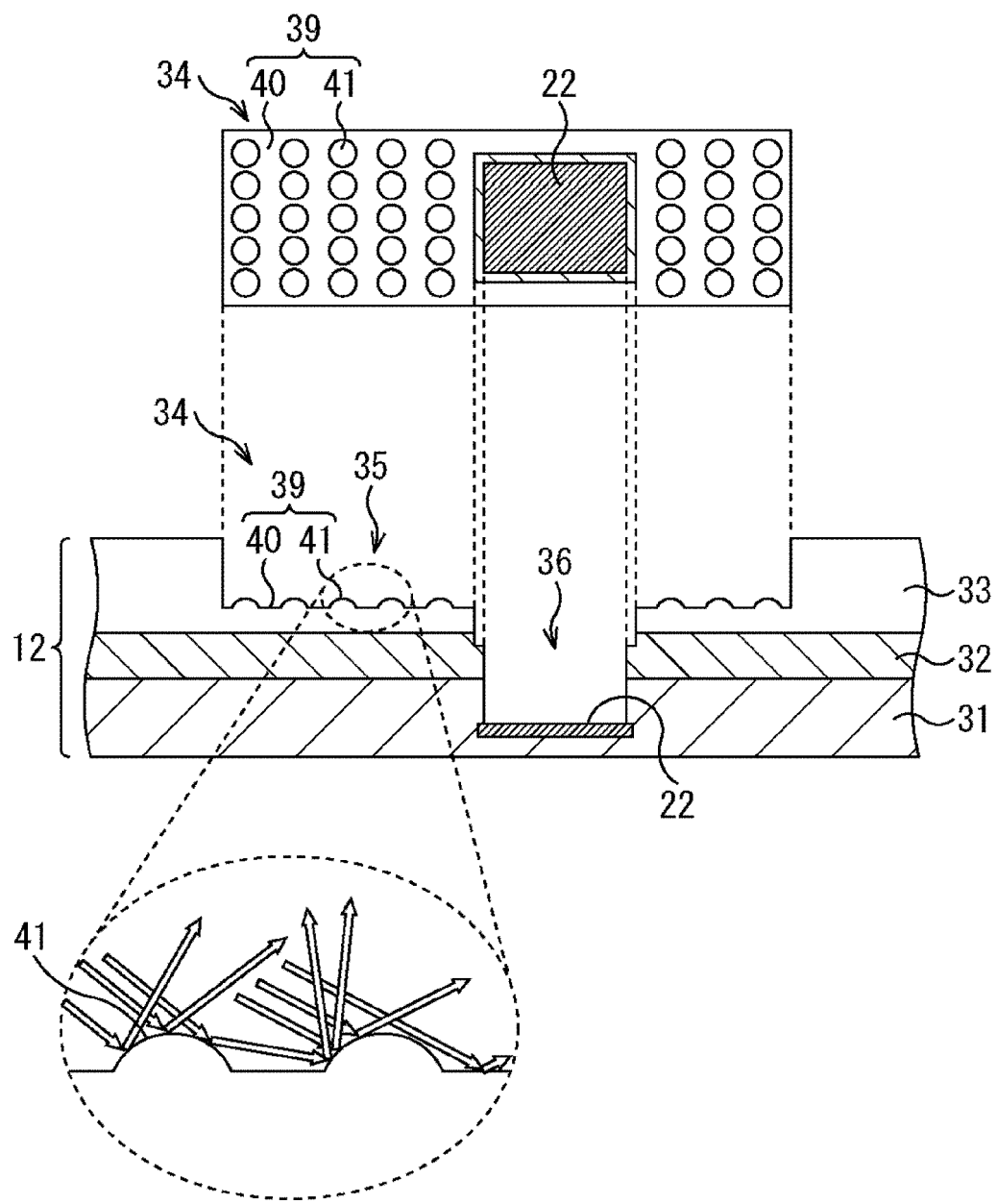
FIG. 2 is a diagram illustrating a cross-sectional exemplary structure in the vicinity of a pad open portion.

Next, FIG. 2 illustrates the vicinity of the pad open portion formed in the imaging element 12 in an enlarged manner. Note that FIG. 2 illustrates a state before the bonding wire 24 is connected to the metal pad 22.

As illustrated in FIG. 2, the imaging element 12 has a structure obtained by layering a wiring layer 31, a semiconductor substrate 32, and a layered structure film 33.

In the wiring layer 31, a plurality of wires (not illustrated) connected to the pixels 16 and metal pads 22 connected to these wires are formed. For example, the wiring layer 31 has a structure in which the wires are insulated from each other by an inorganic film constituted of an inorganic material.

The semiconductor substrate 32 is, for example, a wafer obtained by slicing single crystal silicon thin, and the photodiode 17 is formed in the semiconductor substrate 32 for each of the pixels 16 in the imaging region 21 of FIG. 1.

The layered structure film 33 is has a structure obtained by layering a plurality of films such as an inorganic film obtained by depositing an inorganic material and an organic film obtained by depositing an organic material. Note that a layered structure of the layered structure film 33 will be described with reference to FIG. 3.

Additionally, in the imaging element 12, a pad open portion 34 is formed by excavating the layered structure film 33, semiconductor substrate 32, and wiring layer 31 so as to form an open portion up to the metal pad 22 from the light incident surface side in order to connect the bonding wire 24 of FIG. 1 to the metal pad 22.

The pad open portion 34 includes: a shallow portion 35 having a shape obtained by shallowly excavating an entire region to be the pad open portion 34; and a deep portion 36 having a shape obtained by deeply excavating a region included in a part of the shallow portion 35 and corresponding to the metal pad 22. The pad open portion 34 having such a shape can allow a shear tool to be inserted into the shallow portion 35 in order that the shear tool may perform a shear test to measure bond strength between the metal pad 22 and the wire bonding ball 25. In other words, it is difficult to perform the shear test in a case where the region corresponding to the metal pad 22 is excavated deeply, whereas it is easy to perform the shear test by providing the shallow portion 35.

For example, the shear test can be performed while the wire bonding ball 25 is held by the shear tool by setting a depth of the shallow portion 35 of the pad open portion 34 such that ¼ of a height of the wire bonding ball 25 protrudes from the deep portion 36 when the wire bonding ball 25 is formed inside the deep portion 36.

Additionally, in the imaging element 12, protruding portions 41 each having a lens-like round shape are formed on a surface of the shallow portion 35 facing an upper side such that the protruding portions protrude from a flat surface 40 formed flat. Thus, a surface of the shallow portion 35 including the flat surface 40 and the protruding portions 41 is located at a middle height from the metal pad 22 bonded to the bonding wire 24 to a highest surface on the light receiving surface side, and has a certain size of area, and hereinafter this surface will be referred to as a counterbore surface 39. Note that it is preferable that a width of the counterbore surface 39 is set to 10 μm or more, considering that the shear tool is inserted into the shallow portion 35 at the time of wire bonding, however; the width of the counterbore surface 39 is not limited thereto and may be freely set.

Additionally, the pad open portion 34 viewed from the top side is illustrated on an upper side of FIG. 2, and a plurality of protruding portions 41 is periodically arranged on the flat surface 40 in the counterbore surface 39 as illustrated. Thus, in the counterbore surface 39 where the plurality of protruding portions 41 is periodically arranged, light rays indicated by outline arrows are scattered when the light rays are reflected at surfaces of the protruding portions 41 as illustrated in the enlarged manner on a lower side of FIG. 2. Consequently, a reflectance of the light reflected at the counterbore surface 39 can be suppressed.

Here, the protruding portions 41 are arranged so as to have a two-dimensional periodicity with a pitch of about 2 to 5 μm on the counterbore surface 39. Additionally, each of the protruding portions 41 has a protruding shape with a height of at least 50 nm or more and is formed to have a surface shape to be a spherical surface or an aspheric curved surface. Since the protruding portion 41 is formed with such a curved surface, an interference effect by the reflection light is efficiently exerted, and therefore, it is possible to excellently suppress regular light reflection at the counterbore surface 39.

Additionally, the protruding portions 41 are formed in the counterbore surface 39 such that the area of the region where the plurality of protruding portions 41 is formed becomes larger than the area of the flat surface 40 provided between the protruding portions 41.

Furthermore, the pad open portion 34 is formed such that a depth of the deep portion 36, that is, the depth from the surface of the imaging element 12 to the metal pad 22 becomes shorter than ¾ of the height of the wire bonding ball 25 (FIG. 1). Additionally, the counterbore surface 39 is provided at a position excavated from the surface of the imaging element 12 such that the height of the wire bonding ball 25 (FIG. 1) becomes ¾ or less.

Next, a manufacturing method to form the protruding portions 41 on the counterbore surface 39 of the shallow portion 35 at the time of excavating the pad open portion 34 will be described with reference to FIG. 3.

Figure 3:
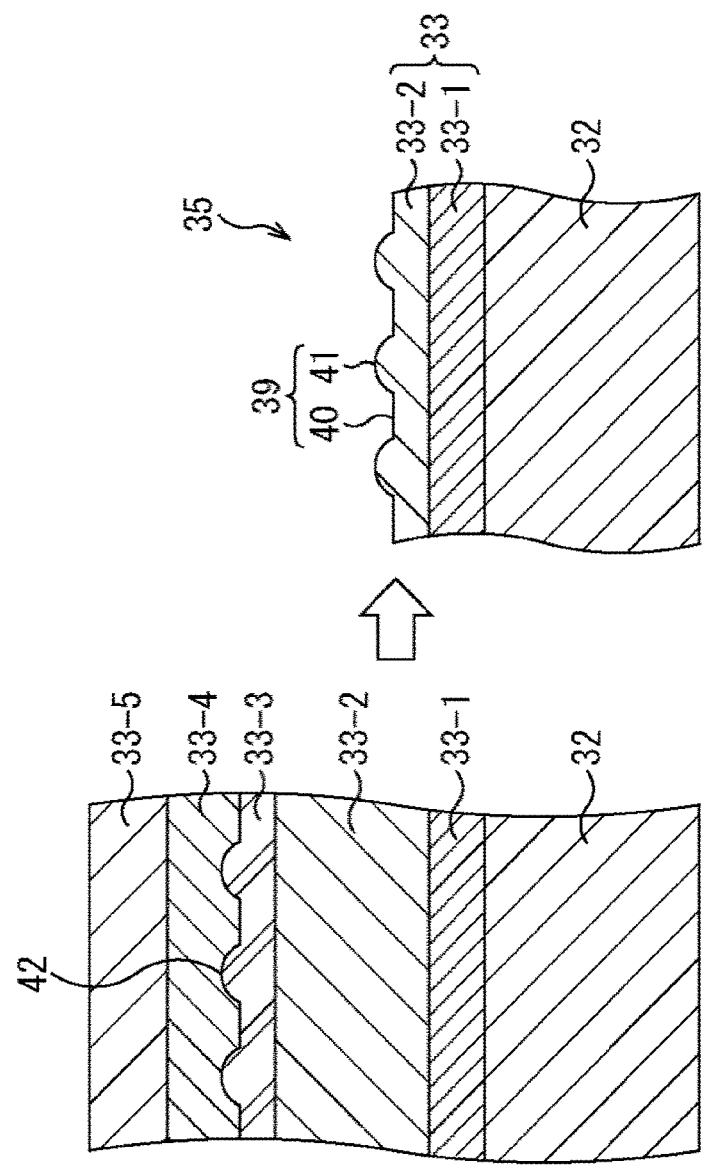
FIG. 3 is a view to describe a manufacturing method to form protruding portions.

For example, as illustrated on a right side of FIG. 3, the layered structure film 33 in the shallow portion 35 has a structure obtained by layering an antireflection film 33-1 and an insulation film 33-2, and the protruding portions 41 are formed on the insulation film 33-2.

To prevent reflection at the semiconductor substrate 32 having a high refractive index relative to visible light (wavelength: 400 to 700 nm), the antireflection film 33-1 for the refractive index is formed between the semiconductor substrate 32 and the insulation film 33-2 by using a material having a relative index between a refractive index of the semiconductor substrate 32 and a refractive index of the insulation film 33-2. For example, a silicon nitride (SiN), a hafnium oxide (HfO2), aluminum oxide (Al2O3), a titanium oxide (TiO2), a strontium titan oxide (STO), and the like can be used for the antireflection film 33-1. Furthermore, these films may be layered and used as the antireflection film 33-1. Additionally, the insulation film 33-2 is formed by using a material having an insulation property to insulate the surface of the semiconductor substrate 32, such as a silicon dioxide (SiO2).

Thus, in the shallow portion 35, the flat antireflection film 33-1 having the refractive index between that of the insulation film 33-2 and that of the semiconductor substrate 32 is provided in an underlayer of the insulation film 33-2 where the protruding portions 41 are formed. Note that, the example of FIG. 3 illustrates a structure in which only one antireflection film 33-1 is interposed between the semiconductor substrate 32 and the insulation film 33-2, however; it may be possible to have a structure in which a plurality of flat films each having the refractive index between that of the semiconductor substrate 32 and that of the insulation film 33-2 is interposed.

Additionally, as illustrated on a left side of FIG. 3, the layer to be the insulation film 33-2 is layered flat on the antireflection film 33-1 before a step of forming the pad open portion 34, and an inner lens layer 33-3, a flattening film 33-4, and an organic film 33-5 are further layered.

The inner lens layer 33-3 is formed by using a material different from the insulation film 33-2, for example, a silicon nitride (SiN), a silicon oxynitride (SiON), an organic film obtained by dispersing metal oxides, or the like, and a small lens 42 that condenses light is formed for each of the pixels 16 in the imaging region 21 of the imaging element 12. The lens 42 may have a structure at least formed only in the imaging region 21 in order to enhance light condensing performance for each of the pixels 16, however; the lens 42 may also have a structure formed in an edge portion of the imaging element 12 where no pixel 16 is formed in a manner similar to the imaging region 21.

The flattening film 33-4 flattens a surface of the inner lens layer 33-3. The organic film 33-5 constitutes: a color filter (filter 18 in FIG. 1) provided for each of the pixels 16 in the imaging region 21 of the imaging element 12; a black resist that shields light to the pixels 16; and the like.

Then, in the step of forming the pad open portion 34, processing is performed such that a shape of each of the lenses 42 of the inner lens layer 33-3 located at a position higher than the counterbore surface 39 is transferred to the insulation film 33-2 by anisotropic dry etching or the like utilizing an etching rate difference between the materials. The shallow portion 35 is excavated so as to form the protruding portions 41 in the insulation film 33-2. With this manufacturing method, the protruding portion 41 can be formed on the counterbore surface 39 of the shallow portion 35 by utilizing the lenses 42 of the inner lens layer 33-3 formed in the related art without adding any step exclusively provided to form the protruding portions 41.

Note that, in the imaging element 12, the organic film 33-5 is removed at the pad open portion 34, but the organic film 33-5 remains in other region such as in the imaging region 21. In other words, the imaging element 12 has a structure in which the organic film 33-5 exists at a position higher than the counterbore surface 39 of the shallow portion 35 of the pad open portion 34. Additionally, it may be possible to adopt not only a structure in which the organic film 33-5 includes only an organic material but also a structure in which predetermined particles are contained in the organic material, for example.

Furthermore, the imaging element 12 has the counterbore surface 39 including the flat surface 40 and the protruding portions 41 is formed at a position lower than the surface of the imaging region 21, for example, at a position lower than the organic film 33-5 constituting the filter 18 and the like in FIG. 1. Note that a layer (not illustrated) in which particles of an organic substance are dispersed is provided in a peripheral region to be the vicinity of the imaging region 21 in a manner similar to the filter 18 provided in the imaging region 21, and the counterbore surface 39 is formed at a position higher than this layer.

Figure 4:
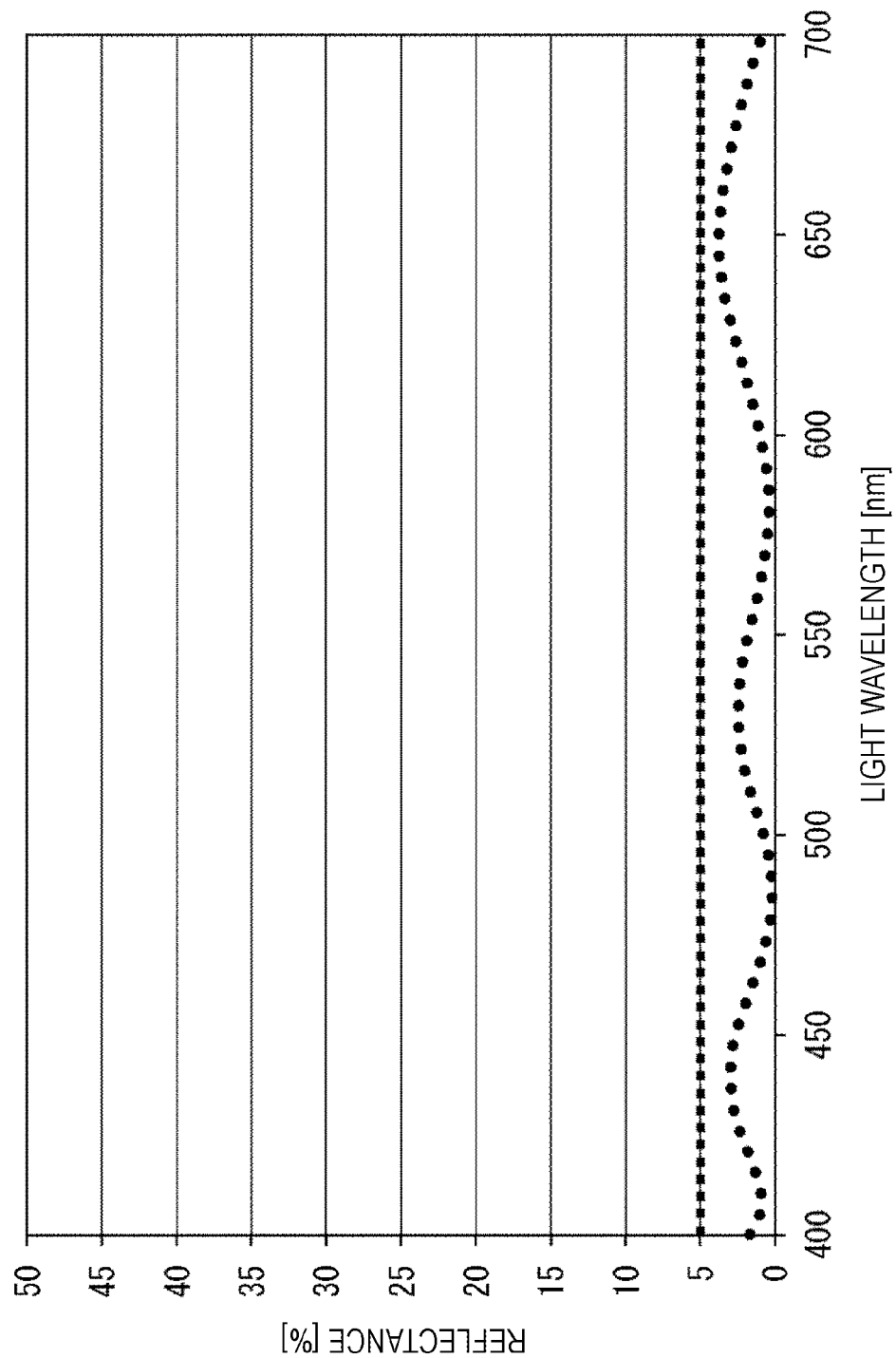
FIG. 4 is a diagram illustrating reflectance data at the pad open portion.

Next, FIG. 4 illustrates reflectance data at the counterbore surface 39.

In FIG. 4, a vertical axis represents reflectance and a horizontal axis represents a wavelength, and illustrated is reflectance at the counterbore surface 39 when the visible light (wavelength: 400 to 700 nm) is incident at a light incident angle of 10 degrees on the shallow portion 35 of the pad open portion 34, for example.

As illustrated in the drawing, the reflectance at the counterbore surface 39 can be made to reflectance 5% or less, which is a target value, in all of wavelength bands. In other words, since light is scattered by the plurality of periodically-arranged protruding portions 41 formed on the counterbore surface 39, the reflectance can be reduced more than that in a structure in which an entire surface of the counterbore surface 39 is formed flat.

For example, even in a case of the structure in which the entire surface of the counterbore surface 39 is flat and a simple layered film structure including films which are basically transparent and have different refractive indexes, such as an oxide film and a nitride film, is formed, there is a wavelength constantly having high reflectance due to wavelength dependence. On the other hand, a wavelength that may cause high reflectance can be prevented by forming the protruding portion 41 on the counterbore surface 39.

Figure 5:
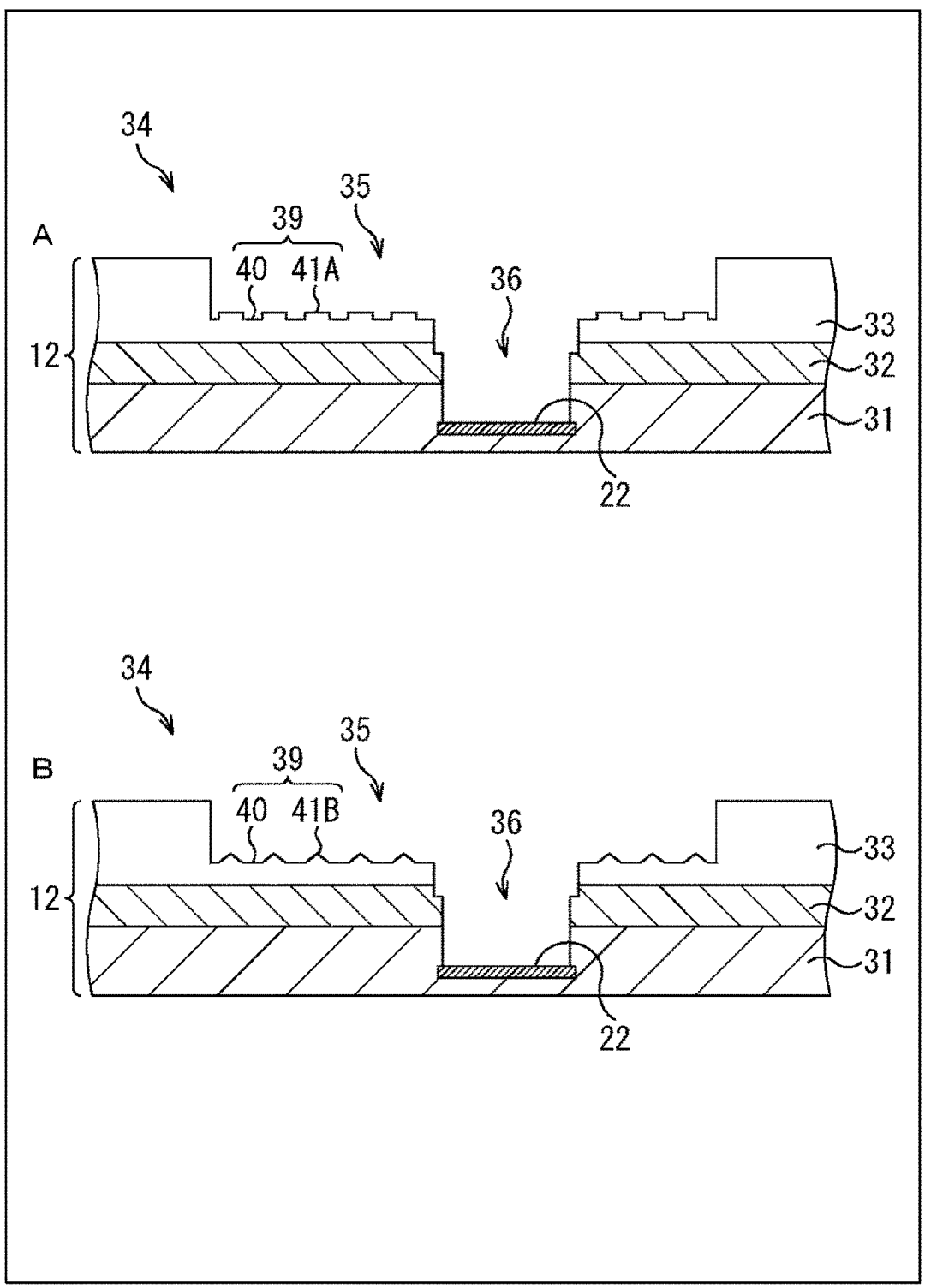
FIG. 5 provides diagrams illustrating other exemplary cross-sectional shapes of the protruding portions.

Next, another exemplary cross-sectional shape of the protruding portion 41 will be described with reference to FIG. 5.

For example, the protruding portion 41 is not limited to the cross-sectional shape of the lens shape (see FIG. 2), and various cross-sectional shapes can be adopted. For example, protruding portions 41A each having a rectangular cross-sectional shape as illustrated in A of FIG. 5, protruding portions 41B each having a pyramidal or conical cross-sectional shape as illustrated in B of FIG. 5, or the like can be formed on the counterbore surface 39. Furthermore, protruding portions having different cross-sectional shapes may be combined, for example, lens-shaped protruding portions 41 and rectangular protruding portions 41A may be arranged in a combined manner on the counterbore surface 39.

Next, variations of the protruding portions 41 will be described with reference to FIGS. 6 to 29.

Figure 6:
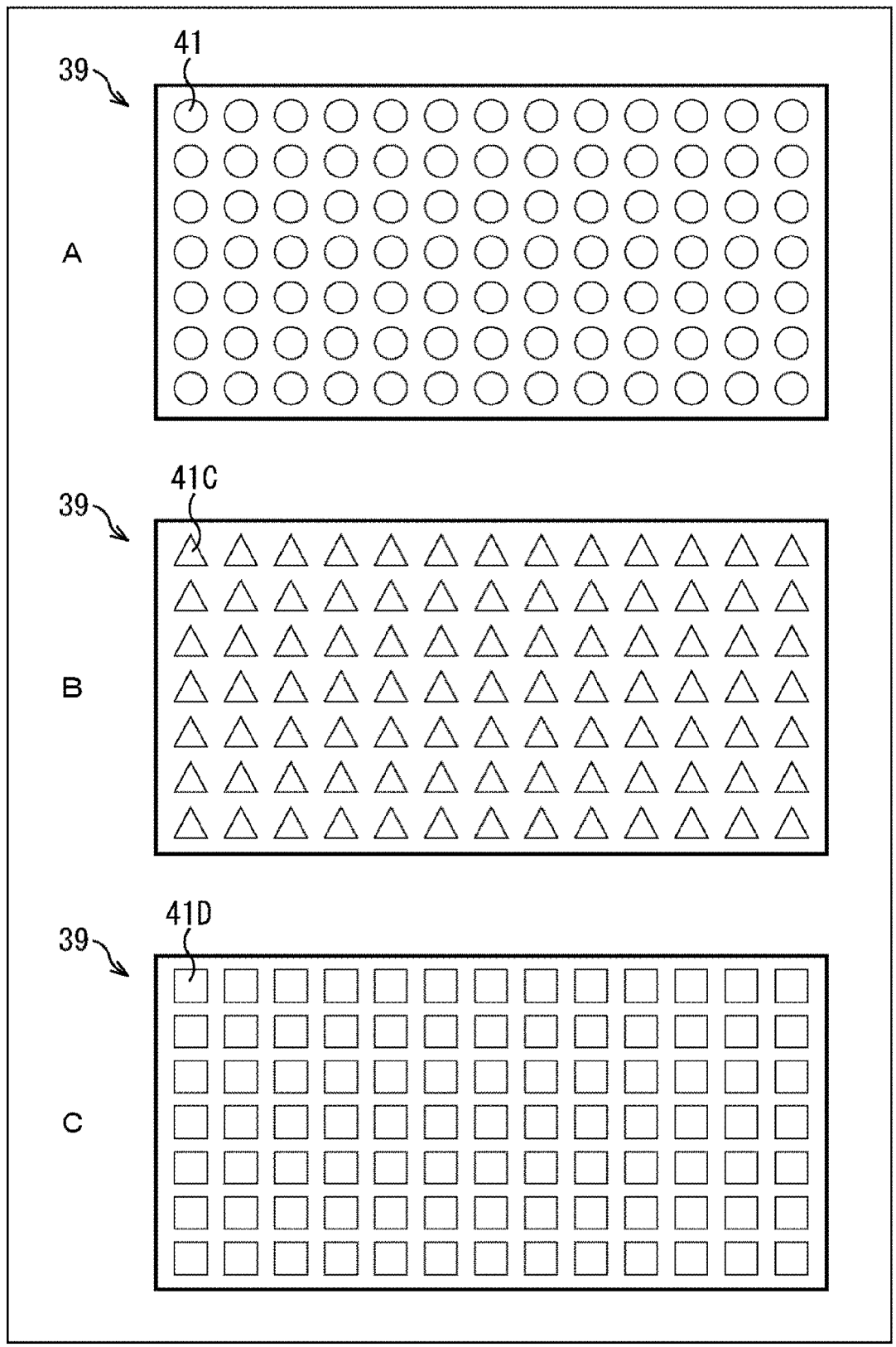
FIG. 6 provides diagrams illustrating variations of planar shapes of the protruding portions.

FIG. 6 illustrates variations of planar shapes of the plurality of protruding portions 41 arranged on the counterbore surface 39.

For example, circular protruding portions 41 in a plan view as illustrated in A of FIG. 6, triangular protruding portions 41C in a plan view as illustrated in B of FIG. 6, square protruding portions 41D as illustrated in C of FIG. 6, and the like can be used. Alternatively, other polygonal shapes may also be adopted as the planar shapes of the protruding portions 41.

Additionally, A of FIG. 6 illustrates an arrangement example in which the plurality of protruding portions 41 is arranged on the counterbore surface 39 so as to be periodic at uniform intervals in an X direction and a Y direction. On the other hand, it may also possible to adopt an arrangement example in which periodicity of arrangement of the plurality of protruding portions 41 is deformed.

Figure 7:
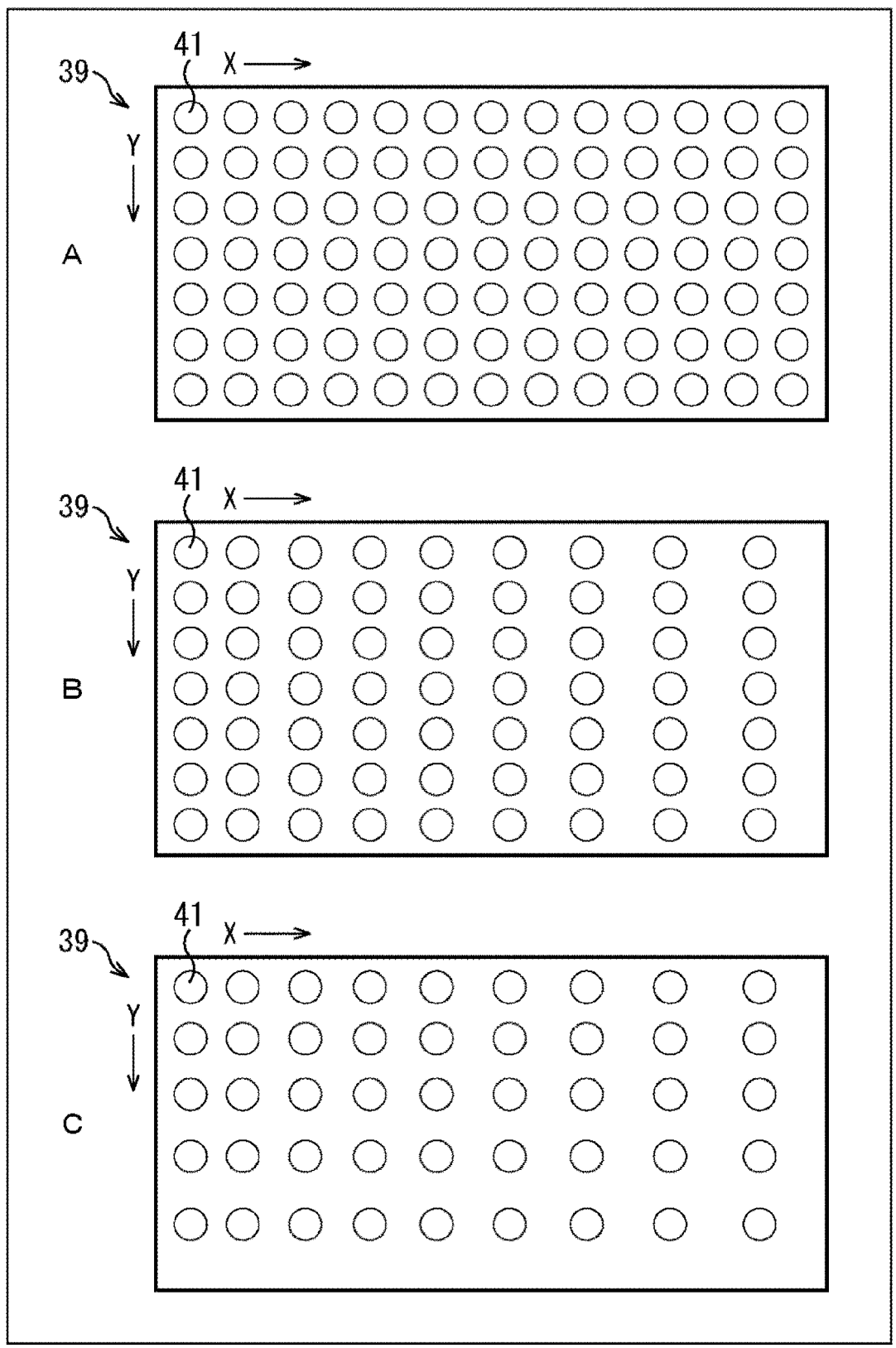
FIG. 7 provides diagrams illustrating arrangement examples in which periodicity of arrangement of a plurality of protruding portions is deformed.

FIG. 7 illustrates variations of arrangement examples of the plurality of protruding portions 41 arranged on the counterbore surface 39.

In the arrangement example illustrated in FIG. A of 7, the plurality of protruding portions 41 is arranged on the counterbore surface 39 so as to be periodic at uniform intervals in the X direction and the Y direction in a manner similar to A of FIG. 6.

On the other hand, as illustrated in B of FIG. 7, it may also be possible to adopt an arrangement example in which the plurality of protruding portions 41 is arranged on the counterbore surface 39 such that periodicity in the X direction is deformed, in other words, the plurality of protruding portions 41 is arranged at non-uniform intervals in the X direction and periodically arranged at uniform intervals in the Y direction. Specifically, B of FIG. 7 illustrates the arrangement example in which the plurality of protruding portions 41 is arranged on the counterbore surface 39 such that an interval becomes wider every column as a position advances in the X direction, and intervals are uniform and periodic in the Y direction.

Furthermore, as illustrated in C of FIG. 7, it may also be possible to adopt an arrangement example in which the plurality of protruding portions 41 is arranged on the counterbore surface 39 such that periodicity in the X direction and the Y direction is deformed, in other words, the plurality of protruding portions 41 is arranged at non-uniform intervals in the X direction and the Y direction. Specifically, C of FIG. 7 illustrates the arrangement example in which the plurality of protruding portions 41 is arranged on the counterbore surface 39 such that an interval becomes wider every column as a position advances in the X direction and an interval becomes wider every row as a position advances in the Y direction.

Note that it is possible to adopt not only the arrangement examples illustrated in B of FIG. 7 and C of FIG. 7 but also an arrangement example in which the plurality of protruding portions 41 is arranged at non-uniform intervals.

Figure 8:
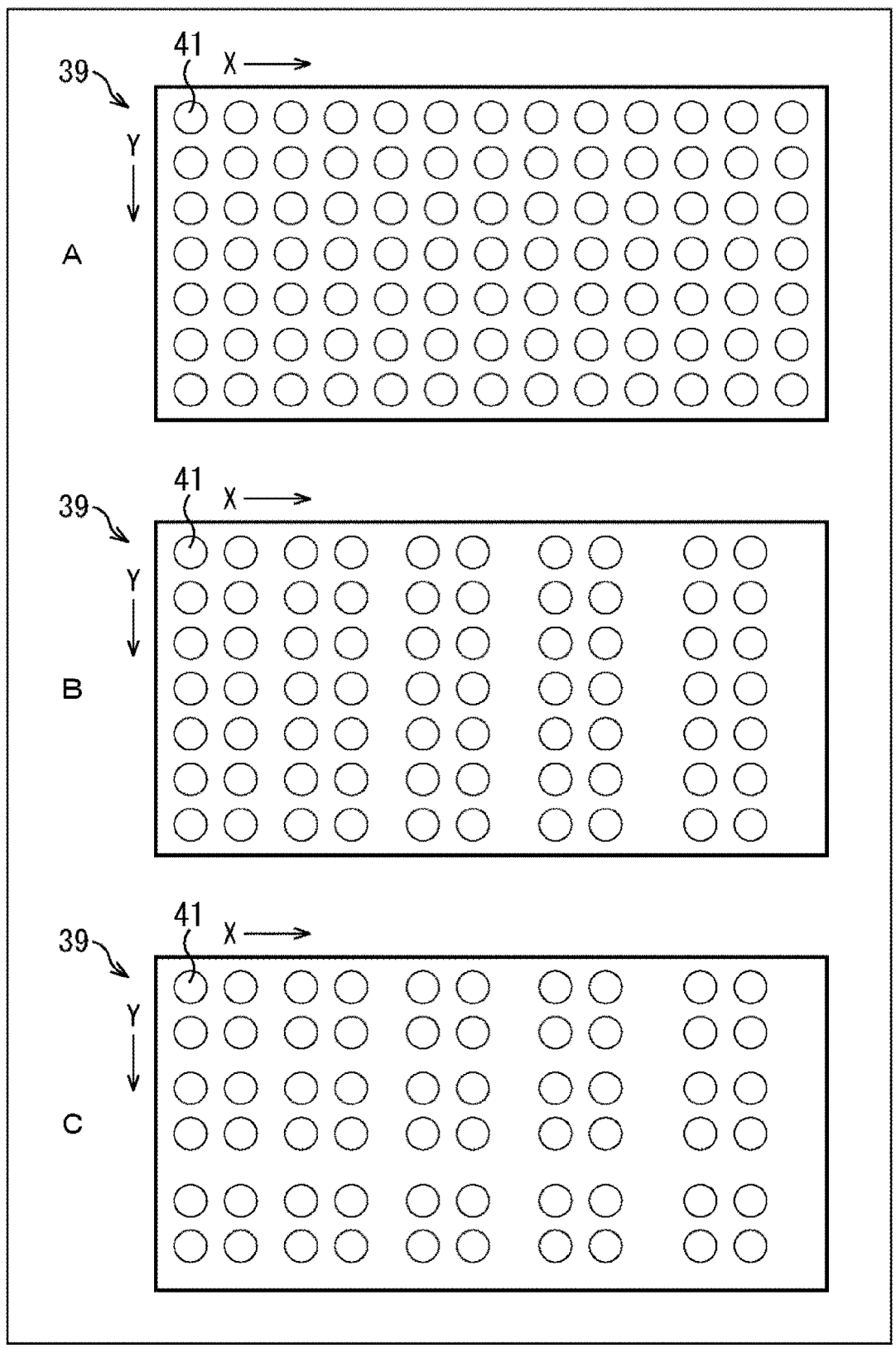
FIG. 8 provides diagrams illustrating arrangement examples in which periodicity of arrangement of a plurality of protruding portions is stepwisely deformed.

FIG. 8 illustrates other variations of arrangement examples of the plurality of protruding portions 41 arranged on the counterbore surface 39.

In the arrangement example illustrated in FIG. A of 8, the plurality of protruding portions 41 is arranged on the counterbore surface 39 so as to be periodic at uniform intervals in the X direction and the Y direction in a manner similar to A of FIG. 7.

On the other hand, as illustrated in B of FIG. 8, it may also be possible to adopt an arrangement example in which the plurality of protruding portions 41 is arranged on the counterbore surface 39 such that periodicity in the X direction is stepwisely deformed, in other words, the plurality of protruding portions 41 is arranged at non-uniform intervals in the X direction every predetermined number of columns, and is periodically arranged at uniform intervals in the Y direction. Specifically, B of FIG. 8 illustrates the arrangement example in which the plurality of protruding portions 41 is arranged on the counterbore surface 39 such that an interval becomes wider every two columns as a position advances in the X direction and an interval becomes uniform and periodic in the Y direction.

Furthermore, as illustrated in C of FIG. 8, it may be possible to adopt an arrangement example in which the plurality of protruding portions 41 is arranged on the counterbore surface 39 such that periodicity of the plurality of protruding portions 41 in both of the X direction and the Y direction is stepwisely deformed, in other words, an interval becomes non-uniform every predetermined number of columns and every predetermined number of rows in the X direction and the Y direction, respectively. Specifically, C of FIG. 8 illustrates an arrangement example in which the plurality of protruding portions 41 is arranged on the counterbore surface 39 such that an interval becomes wider every two columns as a position advances in the X direction and an interval becomes wider every two rows as a position advances in the Y direction.

Note that arrangement examples such as those illustrated in FIGS. 7 and 8 may be used in combination.

Figure 9:
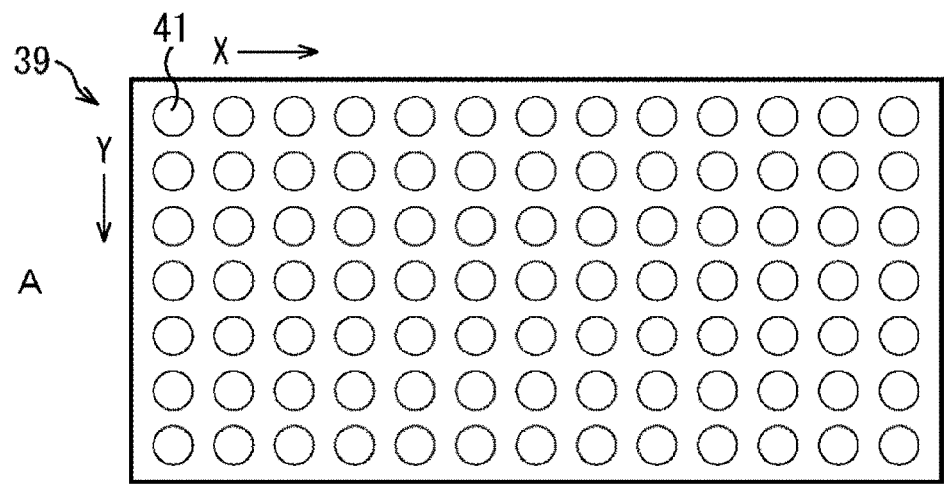
FIG. 9 provides diagrams illustrating arrangement examples in which periodicity of arrangement of a plurality of protruding portions in an X direction is stepwisely deformed and also a periodicity in a Y direction is deformed.
Figure 9:
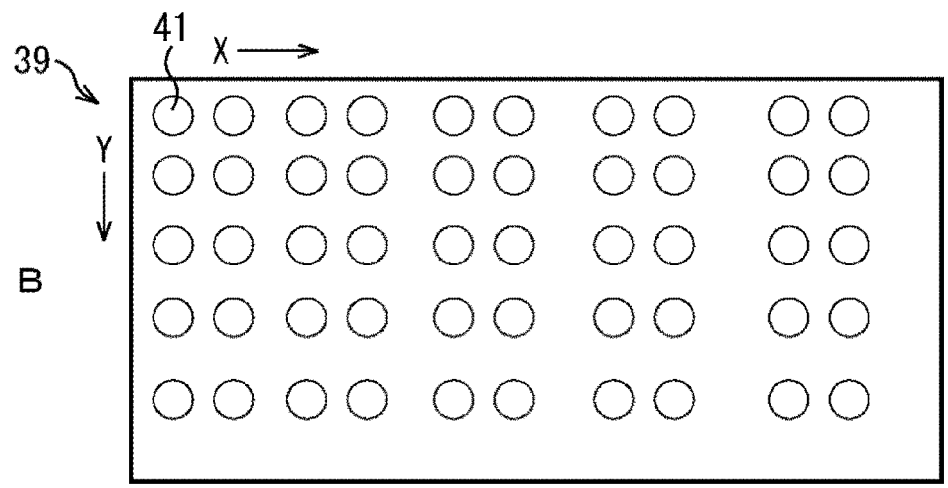
Figure 9:
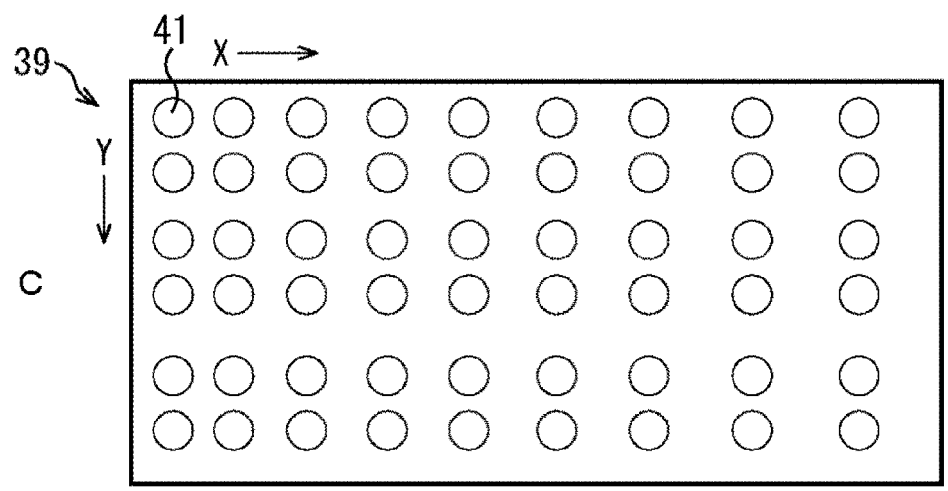

FIG. 9 illustrates other variations of arrangement examples of the plurality of protruding portions 41 arranged on the counterbore surface 39.

In the arrangement example illustrated in A of FIG. 9, the plurality of protruding portions 41 is arranged on the counterbore surface 39 so as to be periodic at uniform intervals in the X direction and the Y direction in a manner similar to A of FIG. 7.

On the other hand, as illustrated in B of FIG. 9, it may also be possible to adopt an arrangement example in which the plurality of protruding portions 41 is arranged on the counterbore surface 39 such that periodicity in the X direction is stepwisely deformed and also periodicity in the Y direction is deformed, in other words, the plurality of protruding portions 41 is arranged at non-uniform intervals in the X direction every predetermined number of columns and is arranged at non-uniform intervals in the Y direction every row. Specifically, B of FIG. 9 illustrates the arrangement example in which the plurality of protruding portions 41 is arranged on the counterbore surface 39 such that an interval becomes wider every two columns as a position advances in the X direction and an interval becomes wider every row as a position advances in the Y direction.

Additionally, as illustrated in C of FIG. 9, it may also be possible to adopt an arrangement example in which the plurality of protruding portions 41 is arranged on the counterbore surface 39 such that periodicity in the X direction is deformed and periodicity in the Y direction is stepwisely deformed, in other words, the plurality of protruding portions 41 is arranged at non-uniform intervals in the X direction every column and arranged at non-uniform intervals in the Y direction every predetermined number of rows. Specifically, C of FIG. 9 illustrates the arrangement example in which the plurality of protruding portions 41 is arranged on the counterbore surface 39 such that an interval becomes wider every column as a position advances in the X direction and an interval becomes wider every two rows as a position advances in the Y direction.

Figure 10:
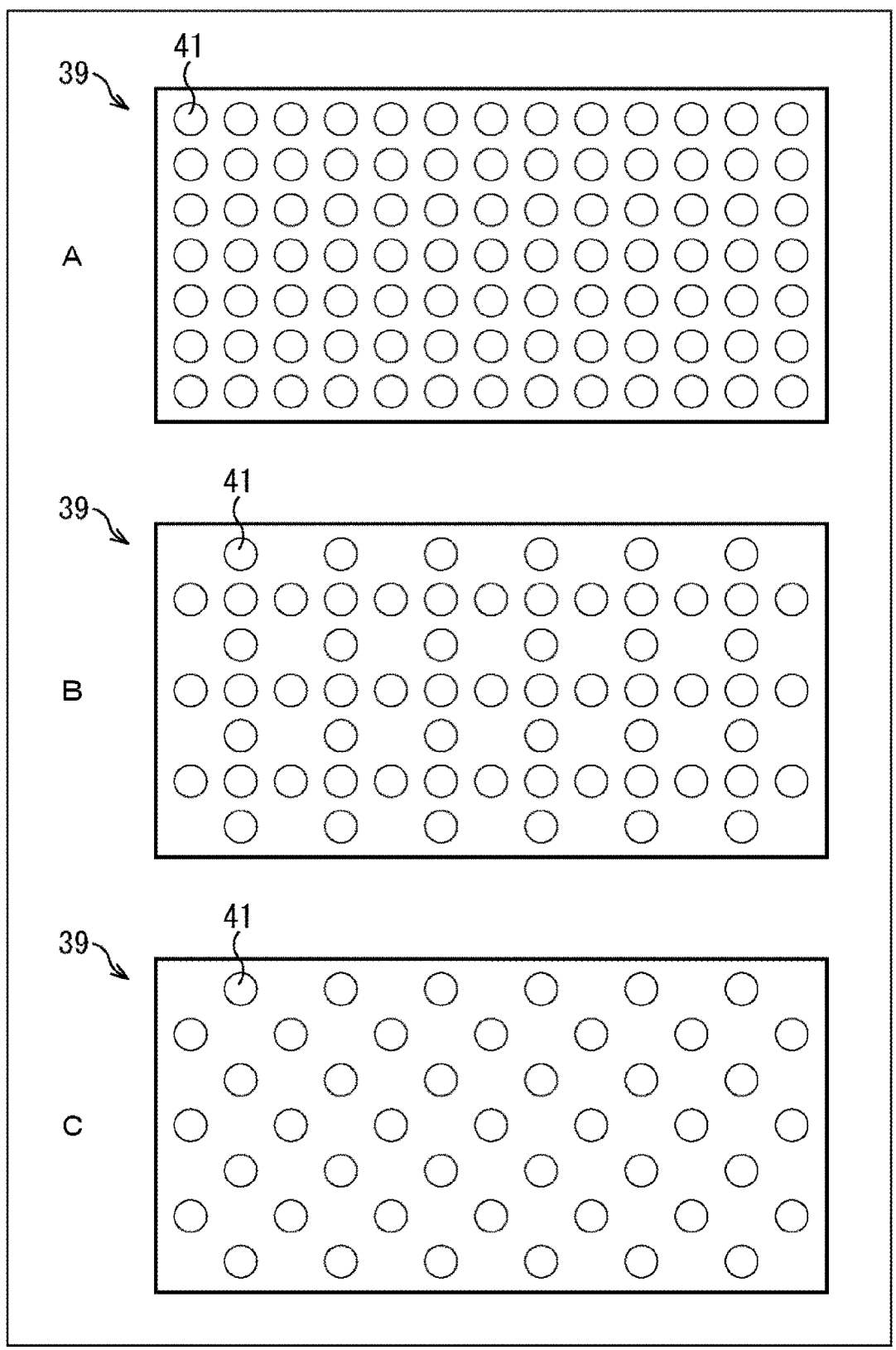
FIG. 10 provides diagrams illustrating arrangement examples in which periodicity of arrangement of a plurality of protruding portions in both of the X direction and Y direction is intentionally deformed.

FIG. 10 illustrates other variations of arrangement examples of the plurality of protruding portions 41 arranged on the counterbore surface 39.

In the arrangement example illustrated in A of FIG. 10, the plurality of protruding portions 41 is arranged on the counterbore surface 39 so as to be periodic at uniform intervals in the X direction and the Y direction in a manner similar to A of FIG. 7.

On the other hand, as illustrated in B of FIG. 10 and C of FIG. 10, it may also be possible to adopt an arrangement example in which the plurality of protruding portions 41 is arranged on the counterbore surface 39 such that periodicity in both of the X direction and Y direction is intentionally deformed, for example, such that a place where no protruding portion 41 is arranged appears periodically. Specifically, B of FIG. 10 illustrates the arrangement example in which the plurality of protruding portions 41 is arranged the counterbore surface 39 such that a column having a row in which a place where no protruding portion 41 is arranged appears every other row is arranged every other column. Additionally, C of FIG. 10 illustrates an arrangement example in which the plurality of protruding portions 41 is arranged on the counterbore surface 39 such that a place where no protruding portion 41 is arranged appears alternately every other row and every other column.

Figure 11:
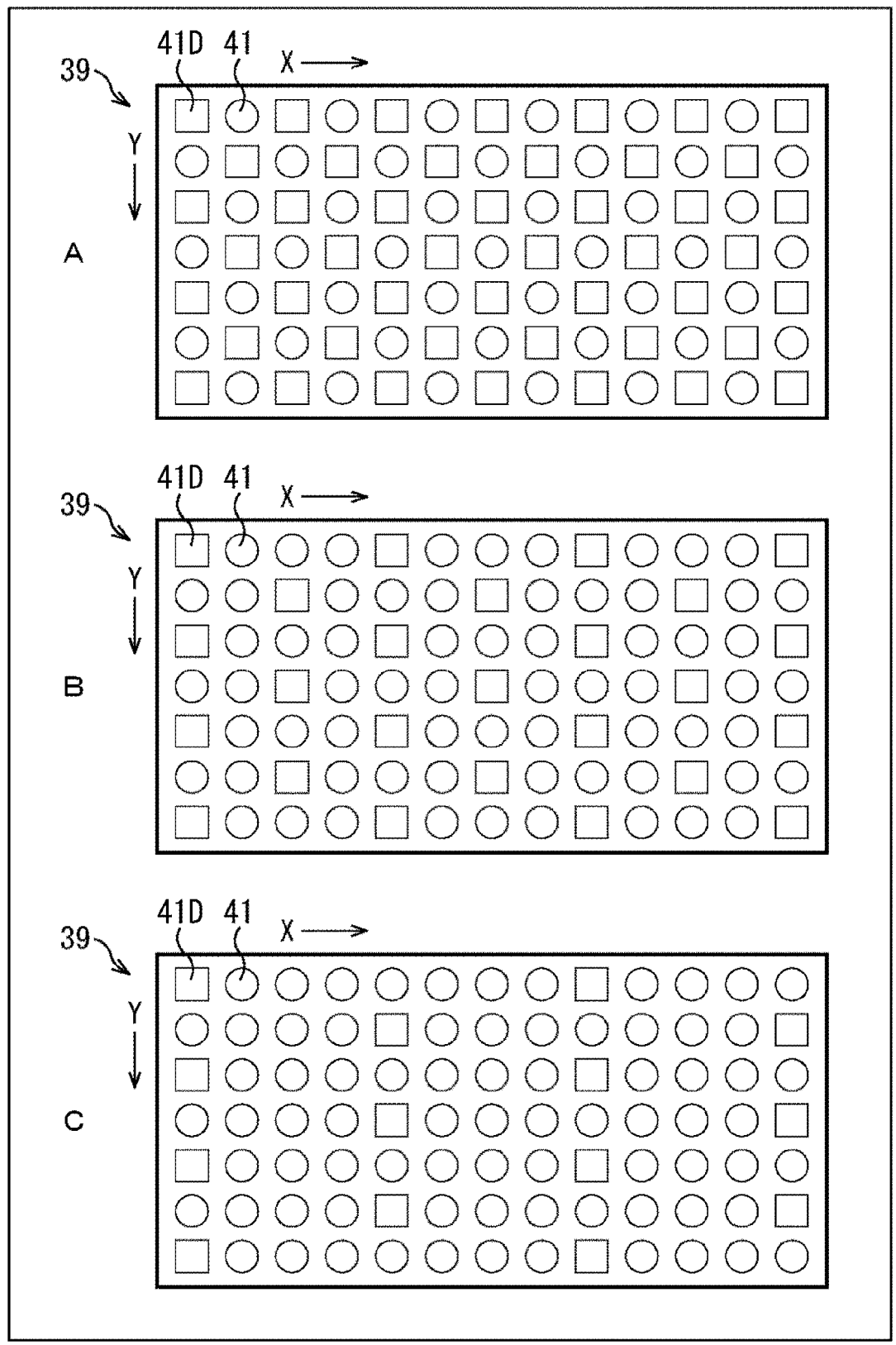
FIG. 11 provides diagrams illustrating arrangement examples in which protruding portions having different shapes are arranged in combination.
Figure 12:
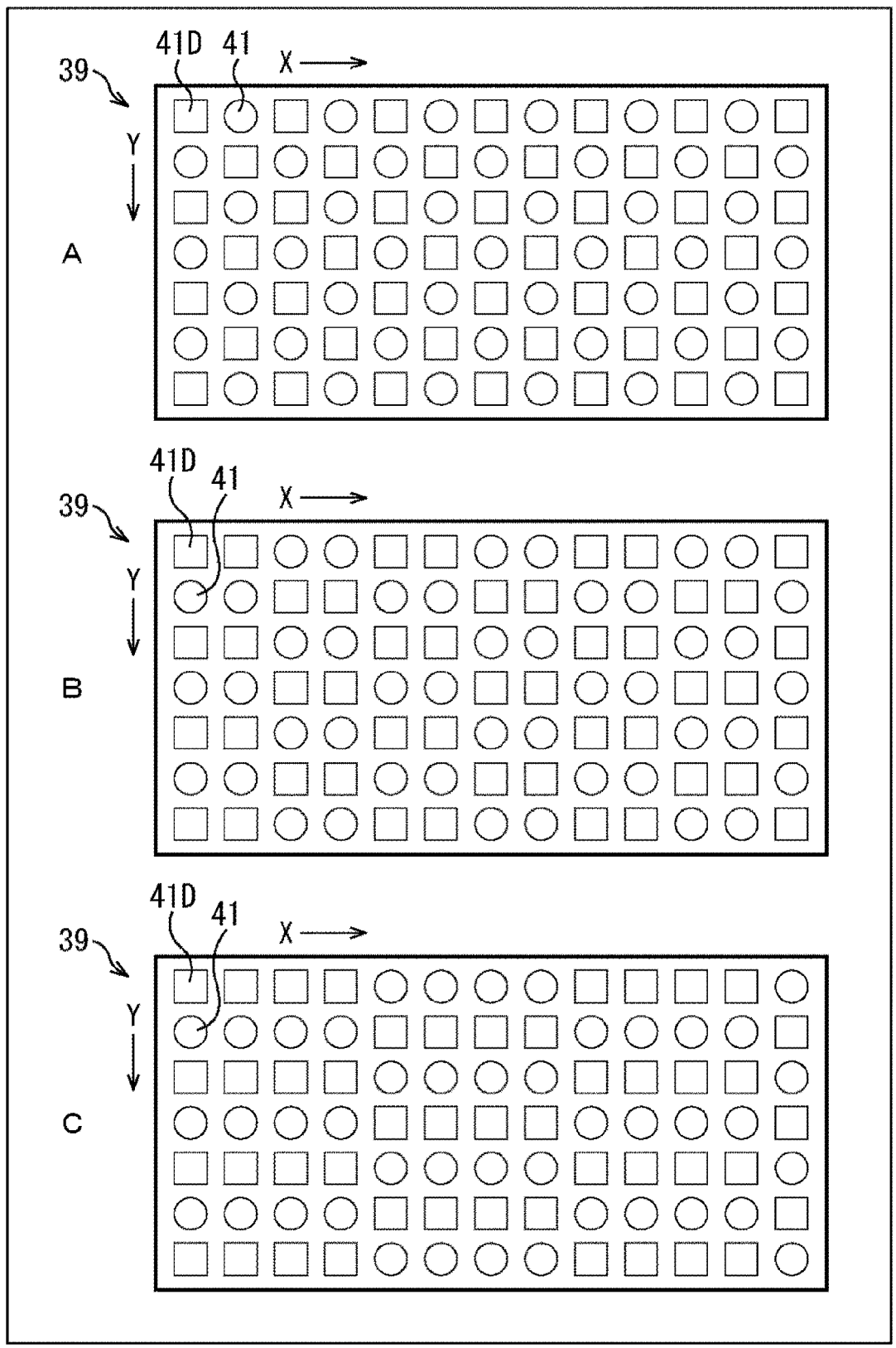
FIG. 12 provides diagrams illustrating arrangement examples in which protruding portions having different shapes are arranged in combination.

Next, FIGS. 11 and 12 illustrate variations of arrangement examples in which circular protruding portions 41 and square protruding portions 41D are arranged in combination.

For example, as illustrated in A of FIG. 11, it may be possible to adopt an arrangement example in which a circular protruding portion 41 and a square protruding portion 41D are alternately arranged one by one in the X direction and the Y direction. Furthermore, as illustrated B of in FIG. 11, it may also be possible to adopt an arrangement example in which a column in which the circular protruding portion 41 and the square protruding portion 41D are alternately arranged one by one in the Y direction and a column in which only the circular protruding portions 41 are arranged are alternately arranged every other column in the X direction. Additionally, as illustrated C of in FIG. 11, it may also be possible to adopt an arrangement example in which a pattern including a column in which a circular protruding portion 41 and a square protruding portion 41D are alternately arranged one by one in the Y direction and three columns in which only the circular protruding portions 41 are arranged is repeatedly arranged in the X direction.

A of FIG. 12 illustrates an arrangement example in which a circular protruding portion 41 and a square protruding portion 41D are alternately arranged one by one in the X direction and the Y direction in a manner similar to A in FIG. 11.

On the other hand, as illustrated in B of FIG. 12, a pattern including two columns in each of which a circular protruding portion 41 and a square protruding portion 41D are alternately arranged one by one in the Y direction and two columns in each of which a circular protruding portion 41 and a square protruding portion 41D are arranged in rows different from the mentioned two columns is repeatedly arranged in the X direction. Additionally, as illustrated in C of FIG. 12, it may also be possible to adopt an arrangement example in which a pattern including four columns in each of which a circular protruding portion 41 and a square protruding portion 41D are alternately arranged one by one in the Y direction and four columns in each of which a circular protruding portion 41 and a square protruding portion 41D are arranged in rows different from the mentioned four columns is repeatedly arranged in the X direction.

Figure 13:
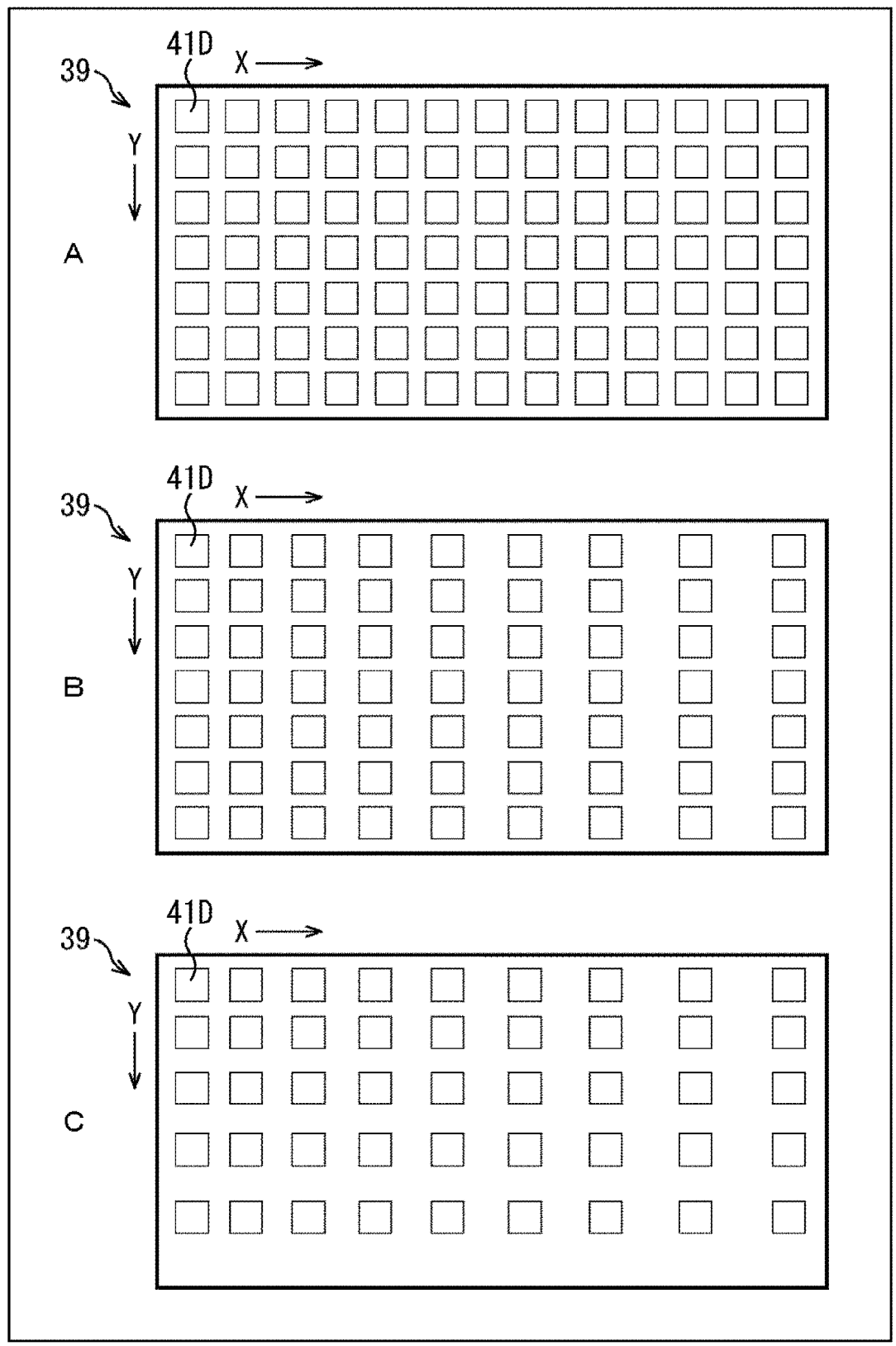
FIG. 13 provides diagrams illustrating arrangement examples in which periodicity of arrangement of a plurality of square protruding portions is deformed.

FIG. 13 illustrates arrangement examples in which square protruding portions 41D are arranged such that periodicity is deformed in a manner similar to FIG. 7.

In other words, A of FIG. 13 illustrates the arrangement example in which the plurality of protruding portions 41D is arranged on the counterbore surface 39 so as to be periodic at uniform intervals in the X direction and the Y direction. B of FIG. 13 illustrates the arrangement example in which the plurality of protruding portions 41D is arranged on the counterbore surface 39 such that an interval becomes wider every column as a position advances in the X direction and intervals become uniform and periodic in the Y direction. C of FIG. 13 illustrates the arrangement example in which the plurality of protruding portions 41D is arranged on the counterbore surface 39 such that an interval becomes wider every column as a position advances in the X direction and an interval becomes wider every row as a position advances in the Y direction.

Figure 14:
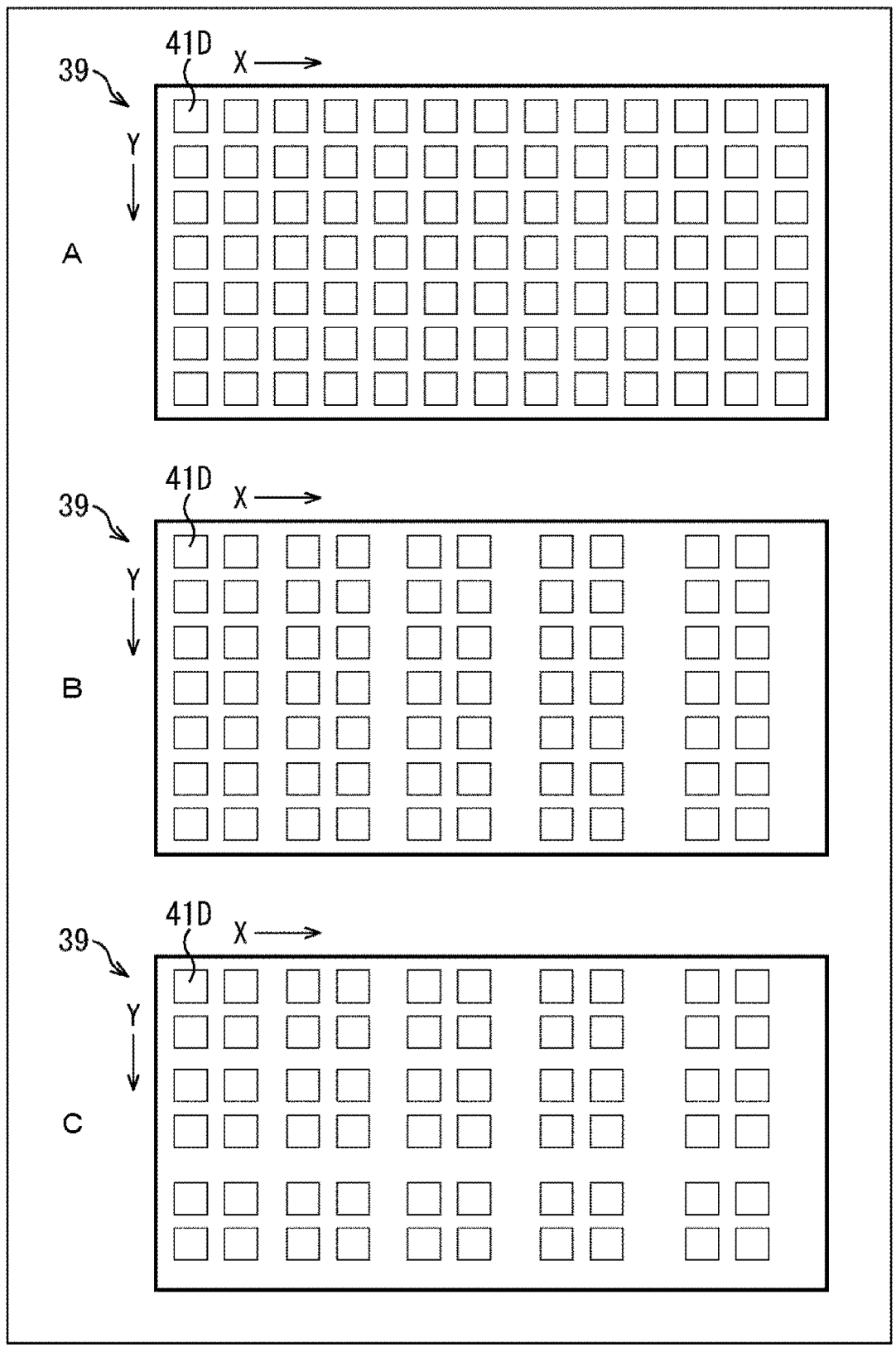
FIG. 14 provides diagrams illustrating arrangement examples in which periodicity of arrangement of a plurality of square protruding portions is stepwisely deformed.

FIG. 14 illustrates arrangement examples in which the square protruding portions 41D are arranged such that periodicity is stepwisely deformed in a manner similar to FIG. 8.

In other words, A of FIG. 14 illustrates the arrangement example in which the plurality of protruding portions 41D is arranged on the counterbore surface 39 so as to be periodic at uniform intervals in the X direction and the Y direction. B of FIG. 14 illustrates the arrangement example in which the plurality of protruding portions 41D is arranged on the counterbore surface 39 such that an interval becomes wider every two columns as a position advances in the X direction and intervals become uniform and periodic in the Y direction. C of FIG. 14 illustrates the arrangement example in which the plurality of protruding portions 41D is arranged on the counterbore surface 39 such that an interval becomes wider every two columns as a position advances in the X direction and an interval becomes wider every two rows as a position advances in the Y direction.

Figure 15:
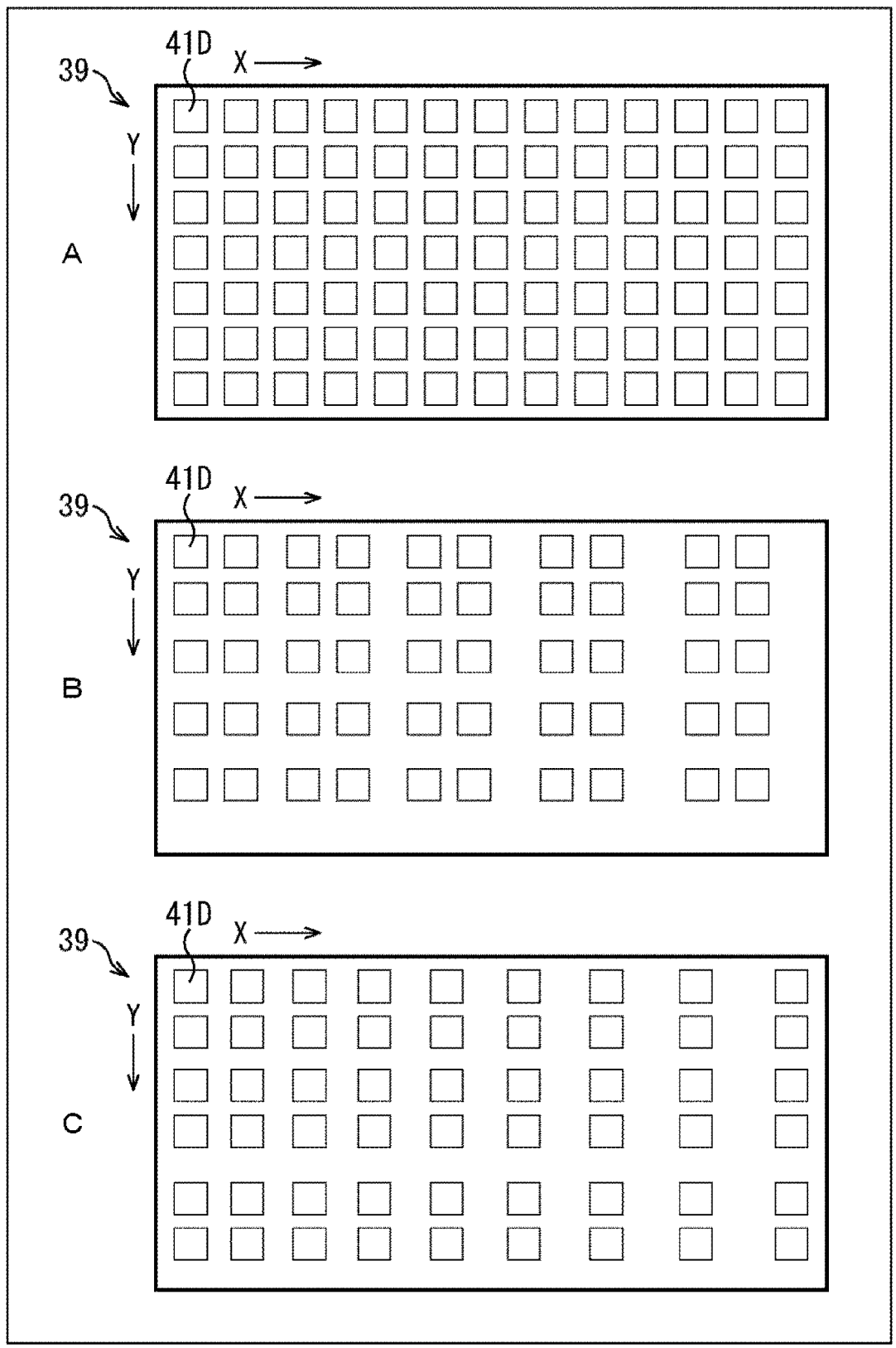
FIG. 15 provides diagrams illustrating arrangement examples in which periodicity of arrangement of a plurality of square protruding portions in the X direction is stepwisely deformed and also periodicity in the Y direction is deformed.

Similar to FIG. 9, FIG. 15 illustrates arrangement examples in which the arrangement examples illustrated in FIGS. 13 and 14 are used in combination.

In other words, A of FIG. 15 illustrates the arrangement example in which the plurality of protruding portions 41D is arranged on the counterbore surface 39 so as to be periodic at uniform intervals in the X direction and the Y direction. B of FIG. 15 illustrates the arrangement example in which the plurality of protruding portions 41D is arranged on the counterbore surface 39 such that an interval becomes wider every two columns as a position advances in the X direction and an interval becomes wider every row as a position advances in the Y direction. C of FIG. 15 illustrates the arrangement example in which the plurality of protruding portions 41D is arranged on the counterbore surface 39 such that an interval becomes wider every column as a position advances in the X direction and an interval becomes wider every two rows as a position advances in the Y direction.

Figure 16:
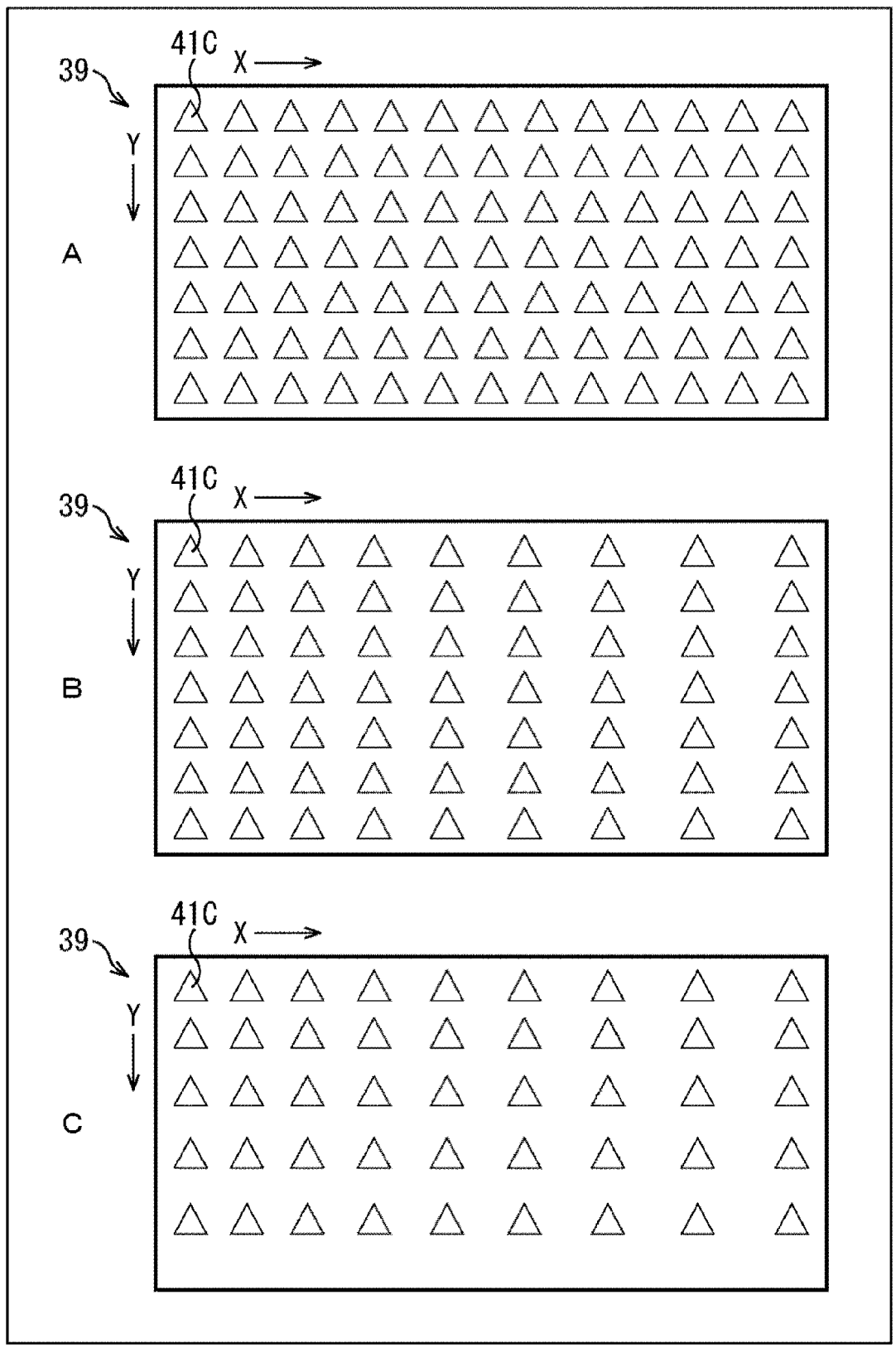
FIG. 16 provides diagrams illustrating arrangement examples in which periodicity of arrangement of a plurality of triangular protruding portions is deformed.

FIG. 16 illustrates arrangement examples in which triangular protruding portions 41C are arranged such that periodicity is deformed in a manner similar to FIG. 7.

A of FIG. 16 illustrates the arrangement example in which the plurality of protruding portions 41C is arranged on the counterbore surface 39 so as to be periodic at uniform intervals in the X direction and the Y direction. B of FIG. 16 illustrates the arrangement example in which the plurality of protruding portions 41C is arranged on the counterbore surface 39 such that an interval becomes wider every column as a position advances in the X direction and intervals become uniform and periodic in the Y direction. C of FIG. 16 illustrates the arrangement example in which the plurality of protruding portions 41C is arranged on the counterbore surface 39 such that an interval becomes wider every column as a position advances in the X direction and an interval becomes wider every row as a position advances in the Y direction.

Figure 17:
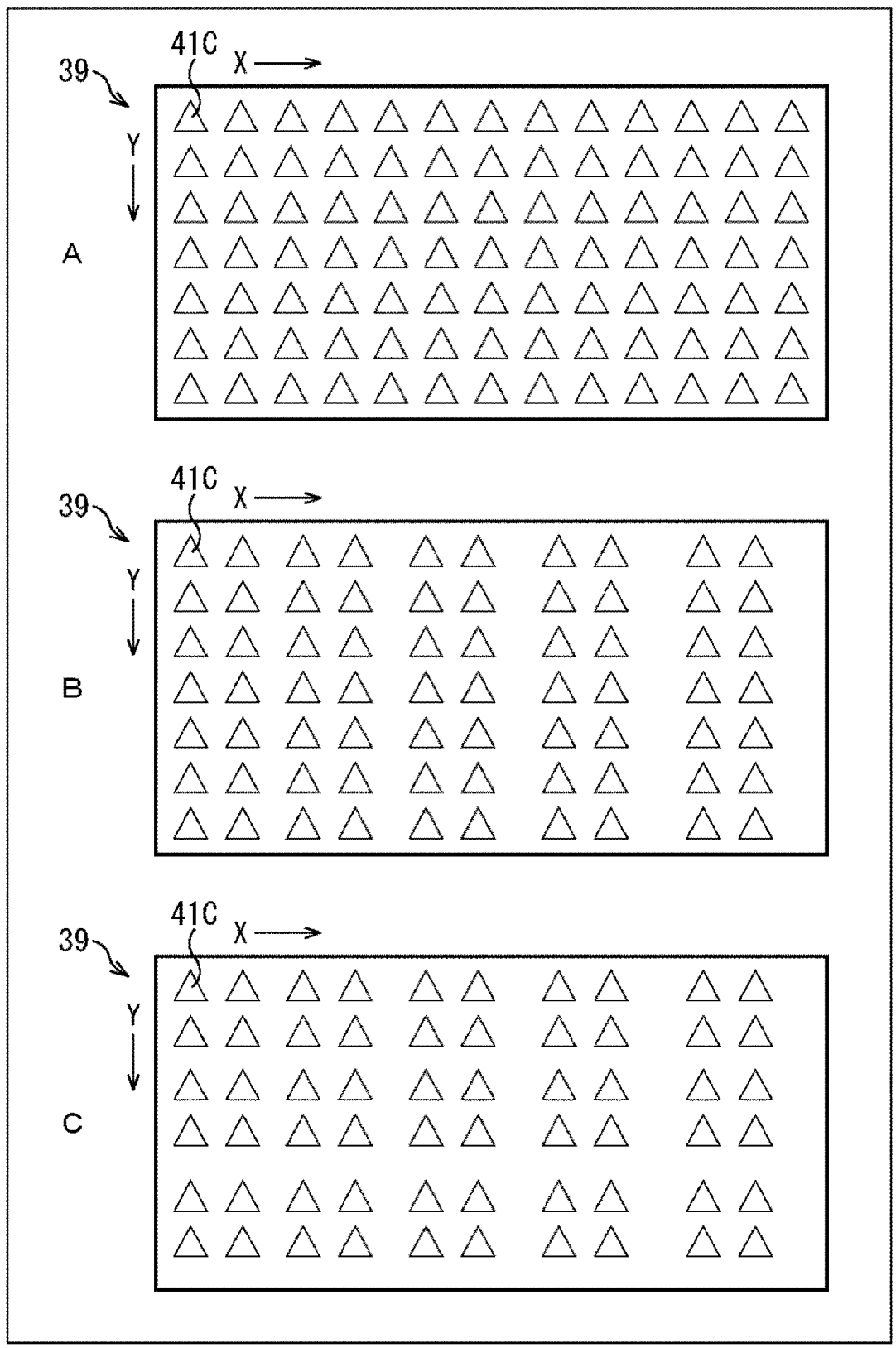
FIG. 17 provides diagrams illustrating arrangement examples in which periodicity of arrangement of a plurality of triangular protruding portions is stepwisely deformed.

FIG. 17 illustrates arrangement examples in which triangular protruding portions 41C are arranged such that periodicity is stepwisely deformed in a manner similar to FIG. 8.

A of FIG. 17 illustrates the arrangement example in which a plurality of protruding portions 41C is arranged on the counterbore surface 39 so as to be periodic at uniform intervals in the X direction and the Y direction. B of FIG. 17 illustrates the arrangement example in which the plurality of protruding portions 41C is arranged on the counterbore surface 39 such that an interval becomes wider every two columns as a position advances in the X direction and intervals become uniform and periodic in the Y direction. C of FIG. 17 illustrates the arrangement example in which the plurality of protruding portions 41C is arranged on the counterbore surface 39 such that an interval becomes wider every two columns as a position advances in the X direction and an interval becomes wider every two rows as a position advances in the Y direction.

Figure 18:
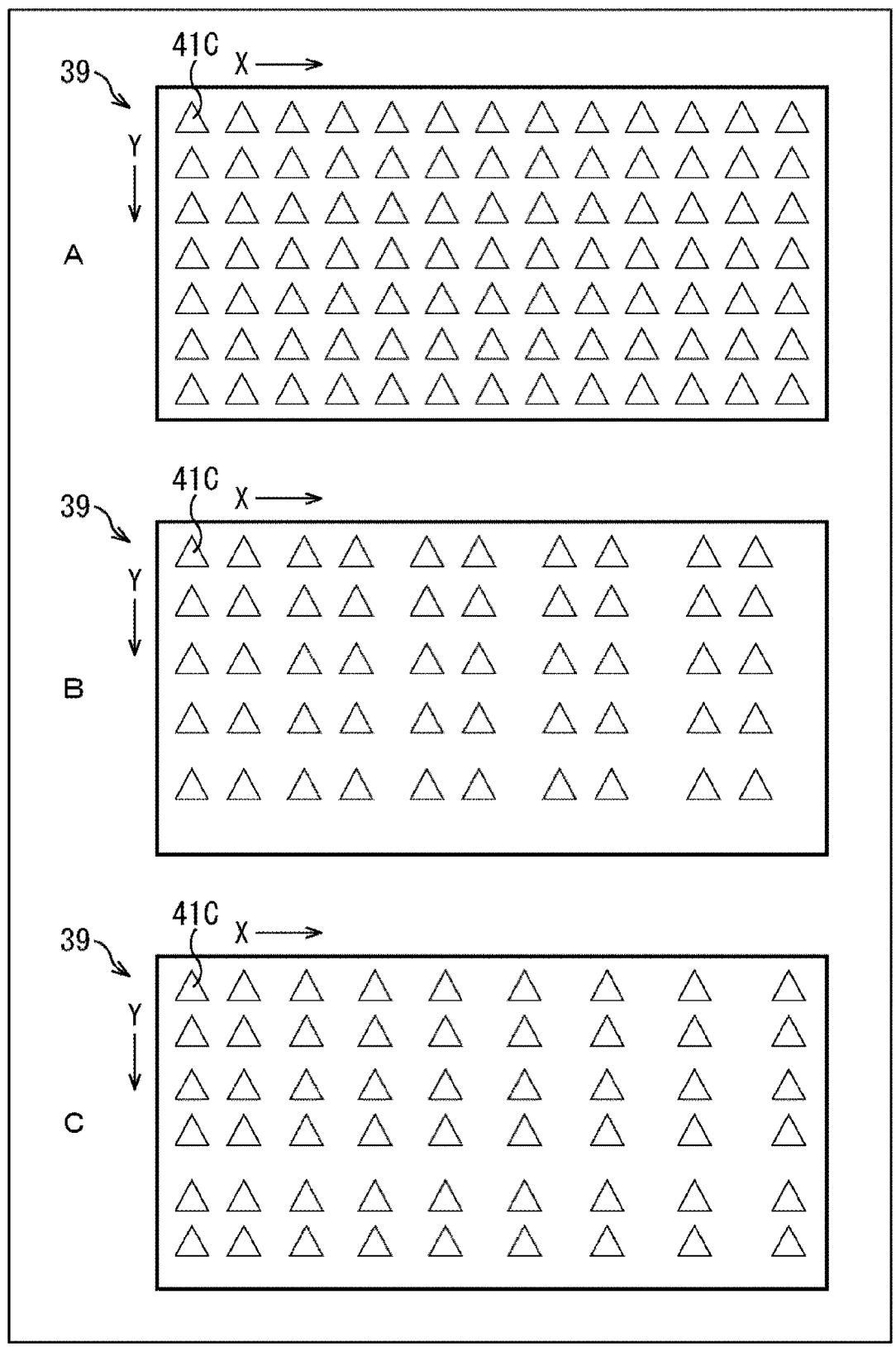
FIG. 18 provides diagrams illustrating arrangement examples in which periodicity of arrangement of a plurality of triangular protruding portions in the X direction is stepwisely deformed and also periodicity in the Y direction is deformed.

Similar to FIG. 9, FIG. 18 illustrates arrangement examples in which the arrangement examples as illustrated in FIGS. 16 and 17 are used in combination.

A of FIG. 18 illustrates the arrangement example in which the plurality of protruding portions 41C is arranged on the counterbore surface 39 so as to be periodic at uniform intervals in the X direction and the Y direction. B of FIG. 18 illustrates the arrangement example in which the plurality of protruding portions 41C is arranged on the counterbore surface 39 such that an interval becomes wider every two columns as a position advances in the X direction and an interval becomes wider every row as a position advances in the Y direction. C of FIG. 18 illustrates the arrangement example in which the plurality of protruding portions 41C is arranged on the counterbore surface 39 such that an interval becomes wider every column as a position advances in the X direction and an interval becomes wider every two rows as a position advances in the Y direction.

Meanwhile, as the protruding portion 41, a shape extending elongated in a plan view of the counterbore surface 39 may also be used.

Figure 19:
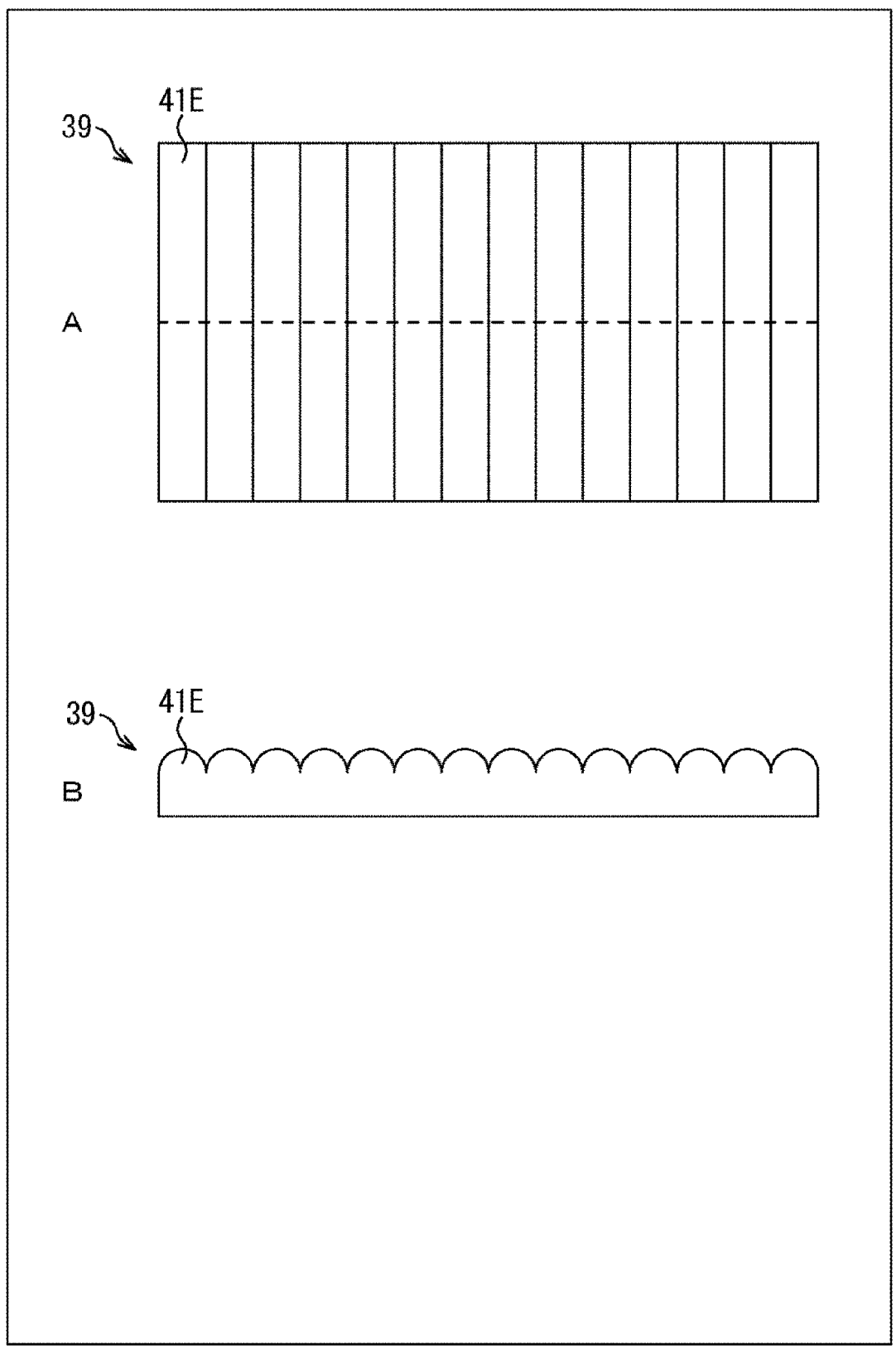
FIG. 19 is a diagram illustrating an arrangement example of protruding portions formed linearly elongated.

FIG. 19 illustrates an arrangement example of protruding portions 41E formed linearly elongated in the plan view of the counterbore surface 39. A of FIG. 19 illustrates a structure of the counterbore surface 39 in the plan view, and B of FIG. 19 illustrates an exemplary cross-sectional structure of the counterbore surface 39 taken along a broken line indicated in A of FIG. 19.

As illustrated in FIG. 19, it may be possible to adopt an arrangement example in which a plurality of protruding portions 41E each having a substantially semicircular cross-sectional shape (so-called semi-cylindrical shape) is formed elongated in a manner linearly extending in a vertical direction and is consecutively arranged in a lateral direction.

Figure 20:
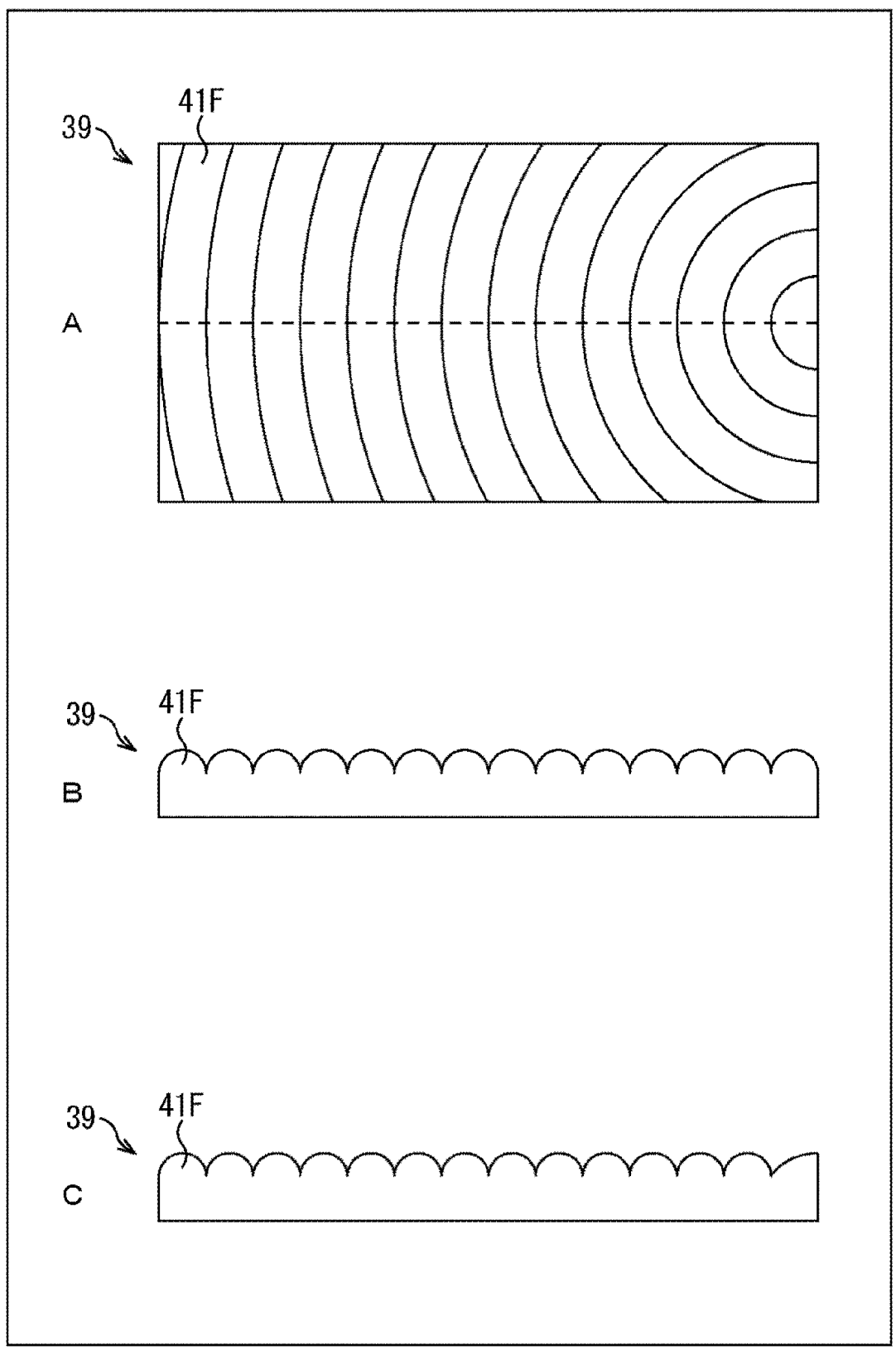
FIG. 20 illustrates an arrangement example of protruding portions formed concentrically elongated.

FIG. 20 illustrates an arrangement example of protruding portions 41F formed concentrically elongated in the plan view of the counterbore surface 39. A of FIG. 20 illustrates a structure of the counterbore surface 39 in the plan view. B of FIG. 20 illustrates a first exemplary cross-sectional structure of the counterbore surface 39 taken along a broken line illustrated in A FIG. 20, and C of FIG. 20 illustrates a second exemplary cross-sectional structure of the counterbore surface 39 taken along the broken line illustrated in A of FIG. 20.

As illustrated in FIG. 20, it may be possible to adopt an arrangement example in which the plurality of protruding portions 41F each having a substantially semicircular cross-sectional shape is formed elongated in a manner extending concentrically around a center of one side of the counterbore surface 39 and is concentrically and consecutively arranged. Note that the protruding portion 41F arranged at the center of the concentric circle can have a shape in which a center thereof is recessed (B in FIG. 20) or a shape in which the center thereof is protruding (C in FIG. 20).

Figure 21:
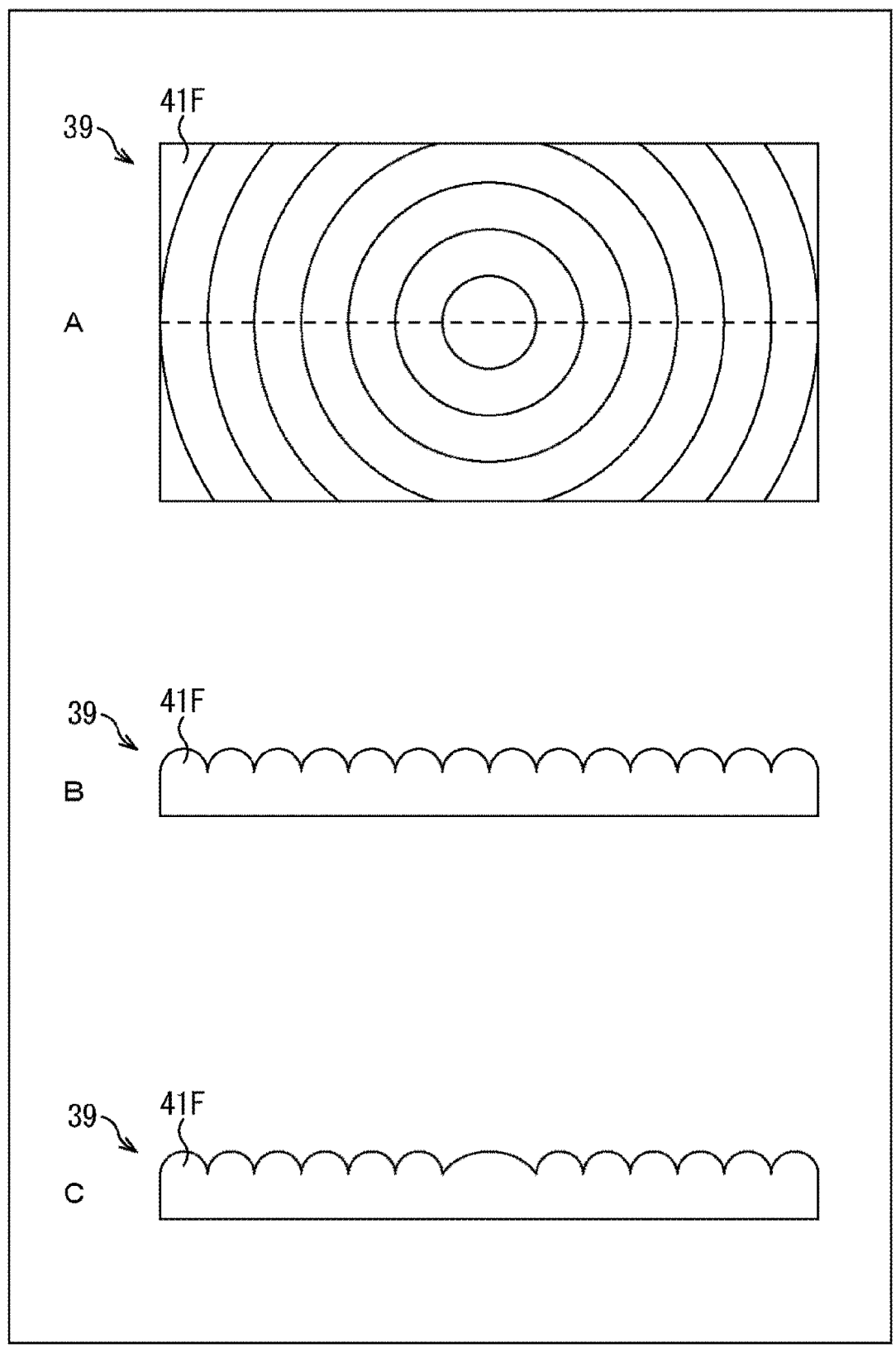
FIG. 21 illustrates an arrangement example of protruding portions formed concentrically elongated.

FIG. 21 illustrates an arrangement example of the protruding portions 41F formed concentrically elongated in the plan view of the counterbore surface 39. A of FIG. 21 illustrates a structure of the counterbore surface 39 in the plan view. B of FIG. 21 illustrates a first exemplary cross-sectional structure of the counterbore surface 39 taken along a broken line illustrated in A of FIG. 21, and C of FIG. 21 illustrates a second exemplary cross-sectional structure of the counterbore surface 39 taken along the broken line illustrated in A of FIG. 21.

As illustrated in FIG. 21, it may also be possible to adopt an arrangement example in which the plurality of protruding portions 41F each having a substantially semicircular cross-sectional shape is formed elongated in a manner extending concentrically around a center the counterbore surface 39 and is concentrically and consecutively arranged. Note that the protruding portion 41F arranged at the center of the concentric circle can have a shape in which a center thereof is recessed (B in FIG. 21) or a shape in which the center thereof is protruding (C in FIG. 21).

Figure 22:
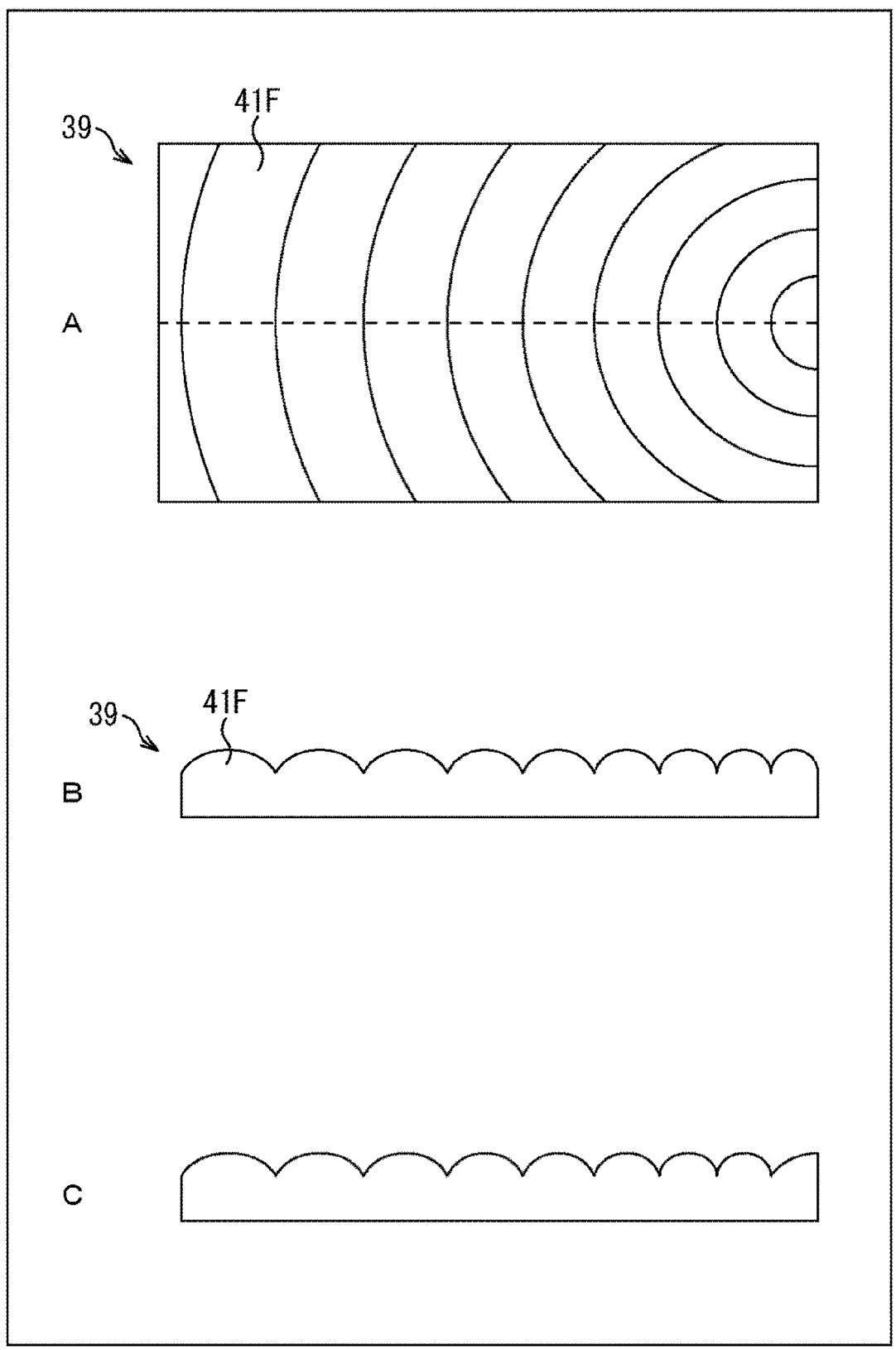
FIG. 22 illustrates an arrangement example of protruding portions formed concentrically elongated.

FIG. 22 illustrates an arrangement example of the protruding portions 41F concentrically formed elongated in the plan view of the counterbore surface 39. A of FIG. 22 illustrates a structure of the counterbore surface 39 in the plan view. B of FIG. 22 illustrates a first exemplary cross-sectional structure of the counterbore surface 39 taken along a broken line illustrated in A of FIG. 22, and C of FIG. 22 illustrates a second exemplary cross-sectional structure of the counterbore surface 39 taken along the broken line illustrated in C of FIG. 22.

As illustrated in FIG. 22, it may be possible to adopt an arrangement example in which the plurality of protruding portions 41F each having a substantially semicircular cross-sectional shape is formed elongated in a manner extending concentrically around a center of the counterbore surface 39 and is arranged concentrically and consecutively, and also a width of each of the protruding portions 41F becomes wider as a position advances to an outer side. Note that the protruding portion 41F arranged at the center of the concentric circle can have a shape in which a center thereof is recessed (B in FIG. 22) or a shape in which the center thereof is protruding (C in FIG. 22).

Figure 23:
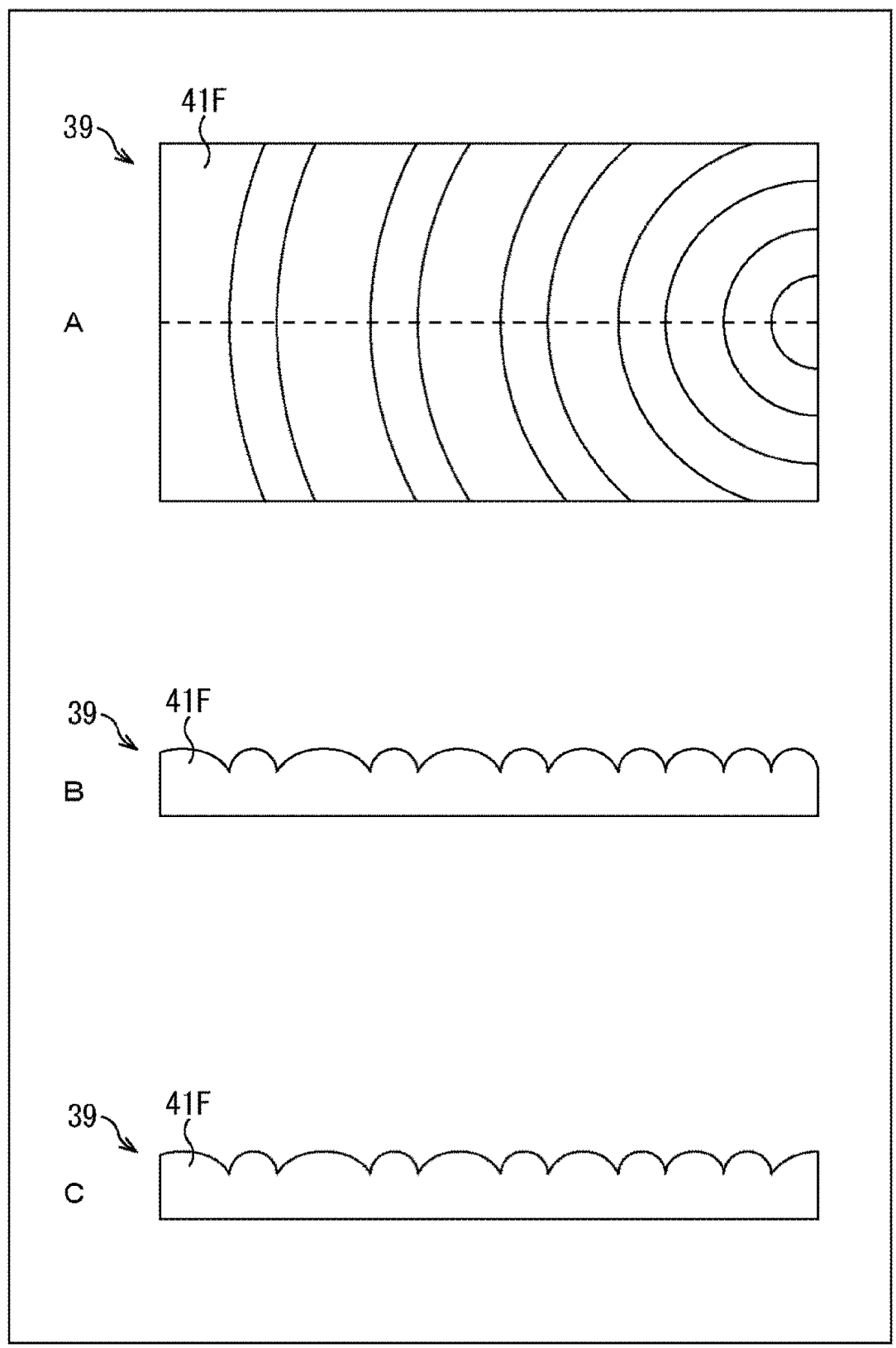
FIG. 23 illustrates an arrangement example of protruding portions formed concentrically elongated.

FIG. 23 illustrates an arrangement example of the protruding portions 41F concentrically formed elongated in the plan view of the counterbore surface 39. A of FIG. 23 illustrates a structure of the counterbore surface 39 in the plan view. B of FIG. 23 illustrates a first exemplary cross-sectional structure of the counterbore surface 39 taken along a broken line illustrated in A of FIG. 23, and C of FIG. 23 illustrates a second exemplary cross-sectional structure of the counterbore surface 39 taken along the broken line illustrated in A of FIG. 23.

As illustrated in FIG. 23, it may be possible to adopt an arrangement example in which the plurality of protruding portions 41F each having a substantially semicircular cross-sectional shape is formed elongated in a manner extending concentrically around a center of one side of the counterbore surface 39 and is arranged concentrically and consecutively, and also a width of each of the protruding portions 41F becomes wider as a position advances to the outer side while a width of each protruding portion 41F is alternately different from that of a neighboring one. Note that the protruding portion 41F arranged at the center of the concentric circle can have a shape in which a center thereof is recessed (B in FIG. 23) or a shape in which the center thereof is protruding (C in FIG. 23).

Figure 24:
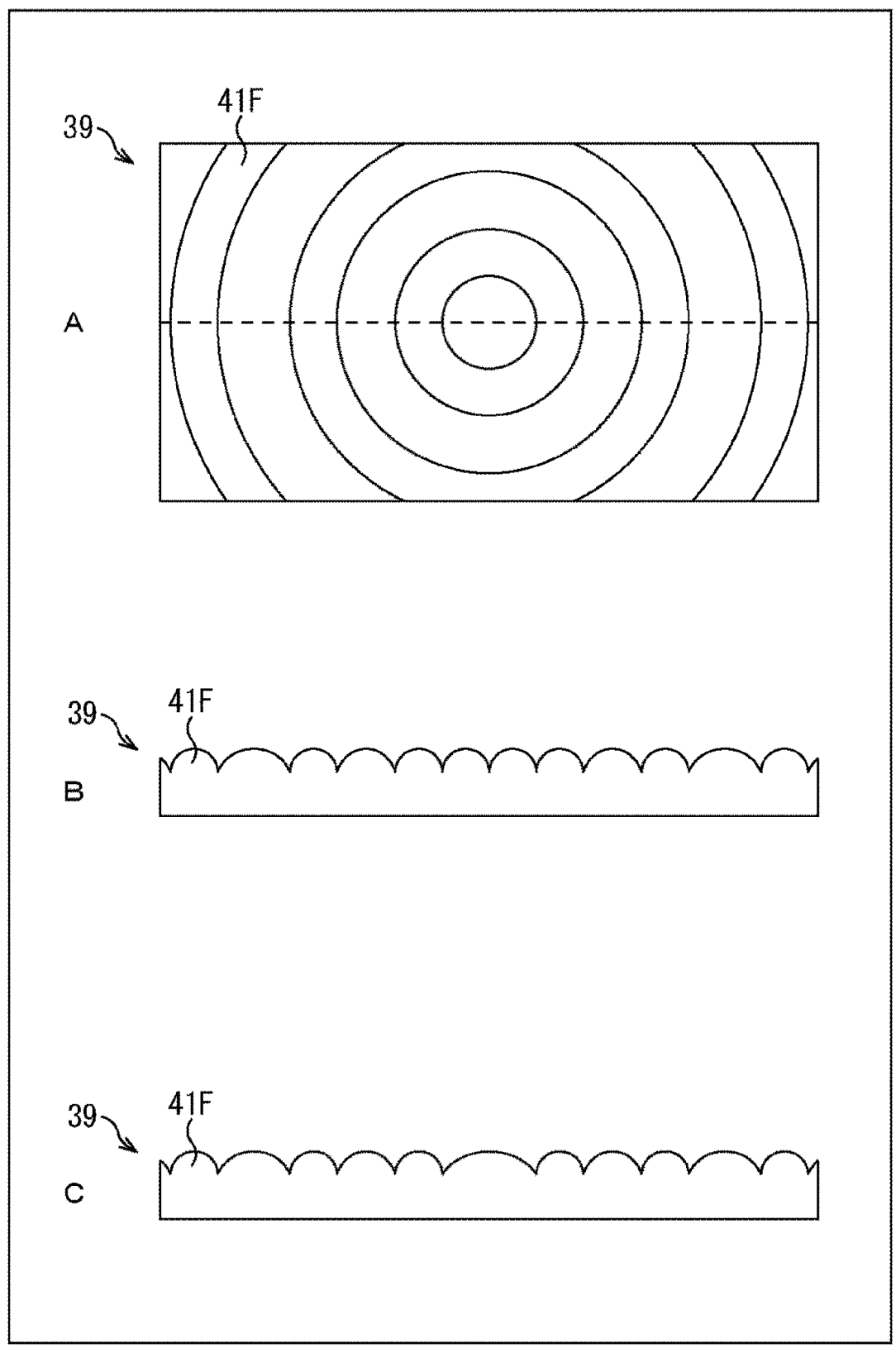
FIG. 24 illustrates an arrangement example of protruding portions formed concentrically elongated.

FIG. 24 illustrates an arrangement example of the protruding portions 41F concentrically formed elongated in the plan view of the counterbore surface 39. A of FIG. 24 illustrates a structure of the counterbore surface 39 in the plan view. B of FIG. 24 illustrates a first exemplary cross-sectional structure of the counterbore surface 39 taken along a broken line illustrated in A of FIG. 24, and C of FIG. 24 illustrates a second exemplary cross-sectional structure of the counterbore surface 39 taken along the broken line illustrated in A of FIG. 24.

As illustrated in FIG. 24, it may be possible to adopt an arrangement example in which the plurality of protruding portions 41F each having a substantially semicircular cross-sectional shape is formed elongated in a manner extending concentrically around a center of the counterbore surface 39 and is arranged concentrically and consecutively, and also a width of each of the protruding portions 41F becomes wider as a position advances to the outer side while a width of each protruding portion 41F is alternately different from that of a neighboring one. Note that the protruding portion 41F arranged at the center of the concentric circle can have a shape in which a center thereof is recessed (B in FIG. 24) or a shape in which the center thereof is protruding (C in FIG. 24).

Figure 25:
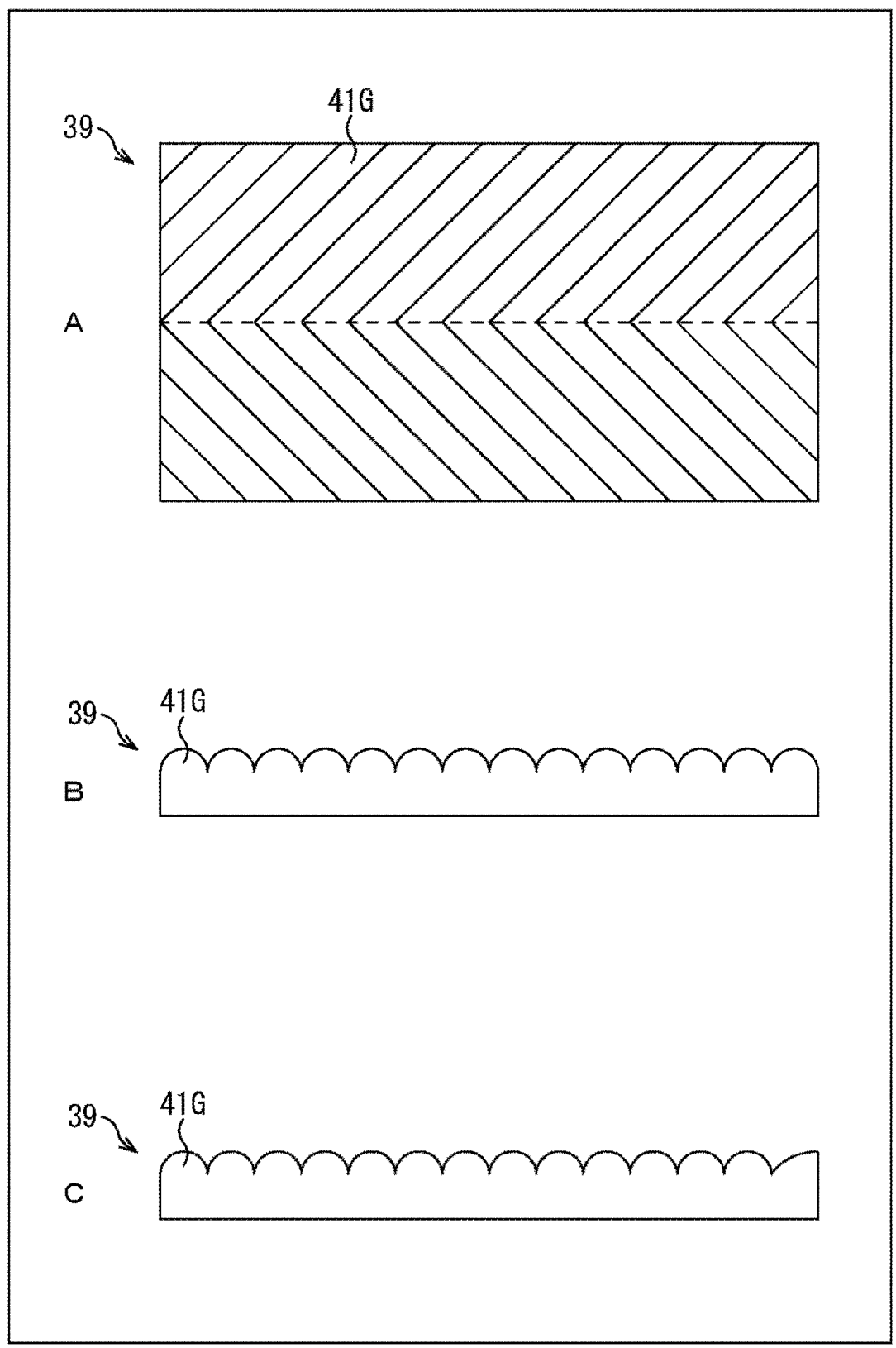
FIG. 25 illustrates an arrangement example of protruding portions formed obliquely elongated.

FIG. 25 illustrates an arrangement example of protruding portions 41G formed obliquely elongated in the plan view of the counterbore surface 39. A of FIG. 25 illustrates a structure of the counterbore surface 39 in the plan view. B of FIG. 25 illustrates a first exemplary cross-sectional structure of the counterbore surface 39 taken along a broken line illustrated in A of FIG. 25, and C of FIG. 25 illustrates a second exemplary cross-sectional structure of the counterbore surface 39 taken along the broken line illustrated in A of FIG. 25.

As illustrated in FIG. 25, it may be possible to adopt an arrangement example in which the plurality of protruding portions 41G each having a substantially semicircular cross-sectional shape is formed elongated in V-shapes turned sideways in a manner obliquely extending while setting, as a symmetry axis, a lateral axis passing a center of the counterbore surface 39, and is concentrically and consecutively arranged. Note that the protruding portion 41G arranged at one side of the counterbore surface 39 and shaped in a triangle can have a shape in which a center of the side is recessed (B in FIG. 25) or a shape in which the center of the side is protruding (C in FIG. 25).

Figure 26:
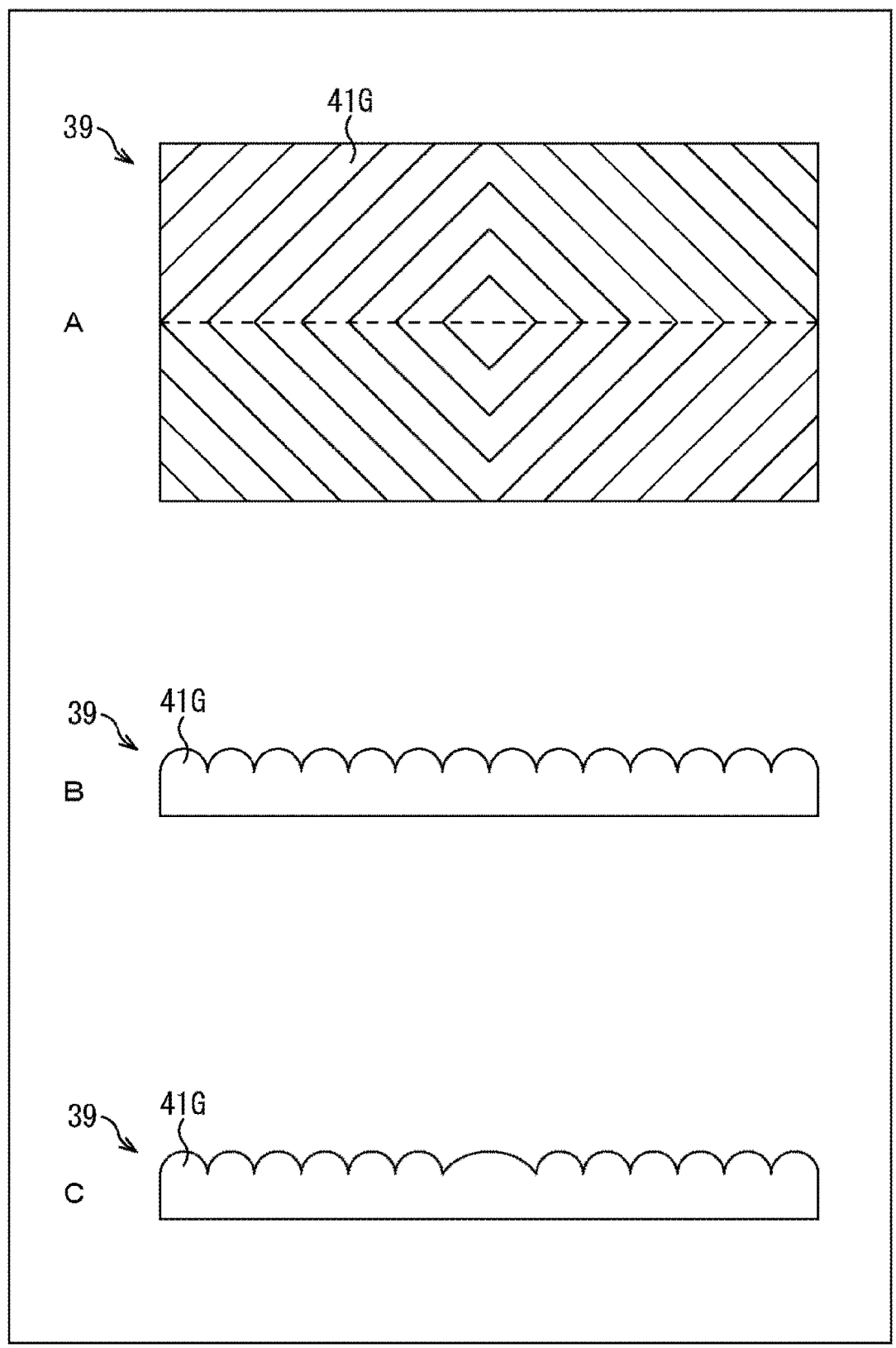
FIG. 26 illustrates an arrangement example of protruding portions formed obliquely elongated.

FIG. 26 illustrates an arrangement example of the protruding portion 41G formed obliquely elongated in the plan view of the counterbore surface 39. A of FIG. 26 illustrates a structure of the counterbore surface 39 in the plan view. B of FIG. 26 illustrates a first exemplary cross-sectional structure of the counterbore surface 39 taken along a broken line illustrated in A of FIG. 26, and C of FIG. 26 illustrates a second exemplary cross-sectional structure of the counterbore surface 39 taken along the broken line illustrated in A of FIG. 26.

As illustrated in FIG. 26, it may be possible to adopt an arrangement example in which the plurality of protruding portions 41G each having a substantially semicircular cross-sectional shape is formed elongated in diamond shapes in a manner obliquely extending while setting, as symmetry axes, a vertical axis and a lateral axis both passing a center of the counterbore surface 39, and is concentrically and consecutively arranged. Note that the rectangular protruding portion 41G arranged at the center of the counterbore surface 39 can have a shape in which a center thereof is recessed (B in FIG. 26) or a shape in which the center thereof is protruding (C in FIG. 26).

Figure 27:
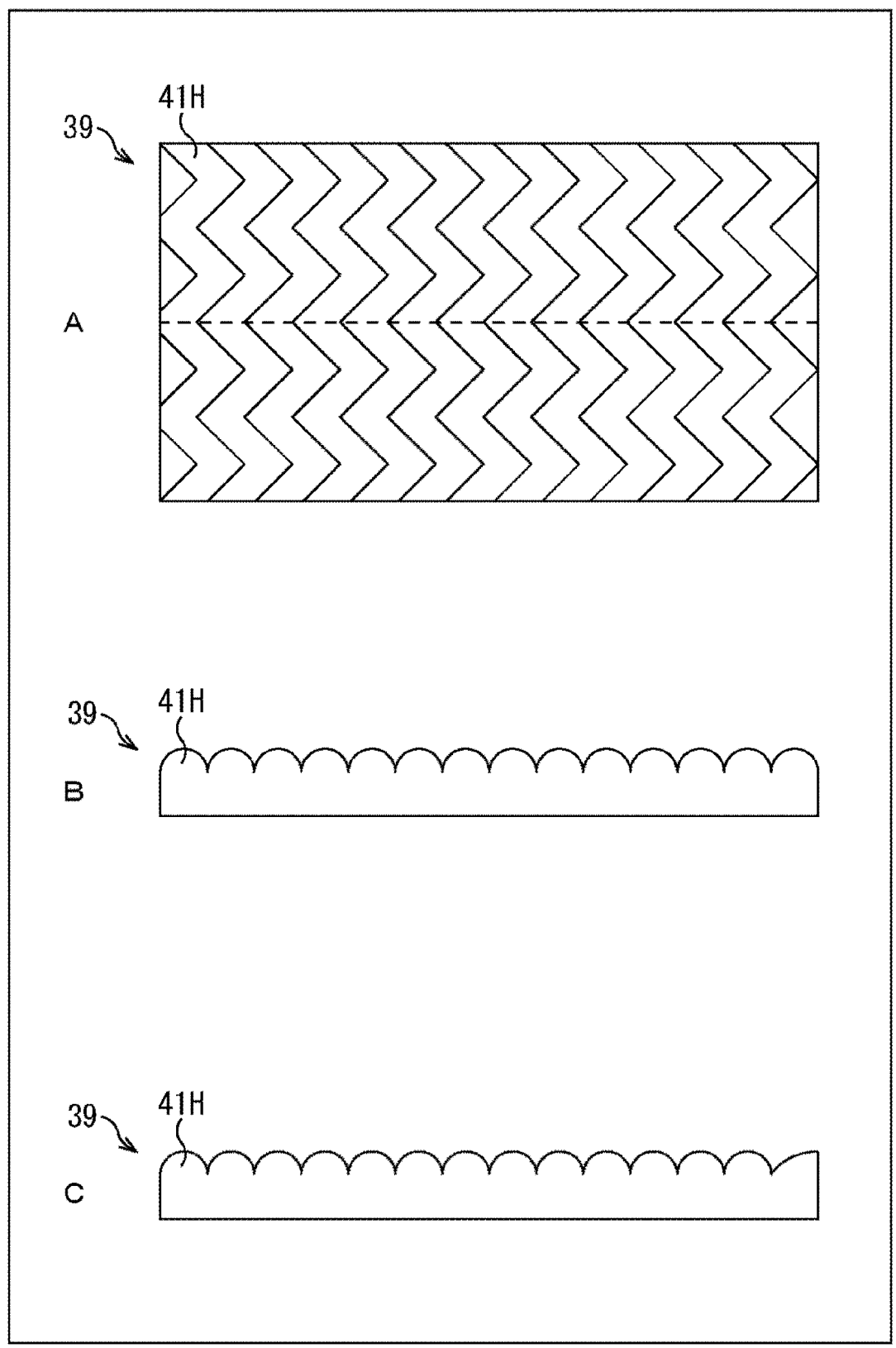
FIG. 27 illustrates an arrangement example of protruding portions formed vertically elongated in a zigzag manner.

FIG. 27 illustrates an arrangement example of protruding portions 41H formed vertically elongated in a zigzag manner (form in which a straight line is repeatedly bent in Z shapes) in the plan view of the counterbore surface 39. A of FIG. 27 illustrates a structure of the counterbore surface 39 in the plan view. B of FIG. 27 illustrates a first exemplary cross-sectional structure of the counterbore surface 39 taken along a broken line illustrated in A of FIG. 27, and C of FIG. 27 illustrates a second exemplary cross-sectional structure of the counterbore surface 39 taken along the broken line illustrated in A of FIG. 27.

As illustrated in FIG. 27, it may be possible to adopt an arrangement example in which the plurality of protruding portions 41H each having a substantially semicircular cross-sectional shape is formed vertically elongated in a zigzag manner, and is consecutively arranged. Note that the protruding portion 41H arranged at one side of the counterbore surface 39 and shaped in a triangle shape can have a shape in which a center of the side is recessed (B in FIG. 27) or a shape in which the center of the side is protruding (C in FIG. 27).

Figure 28:
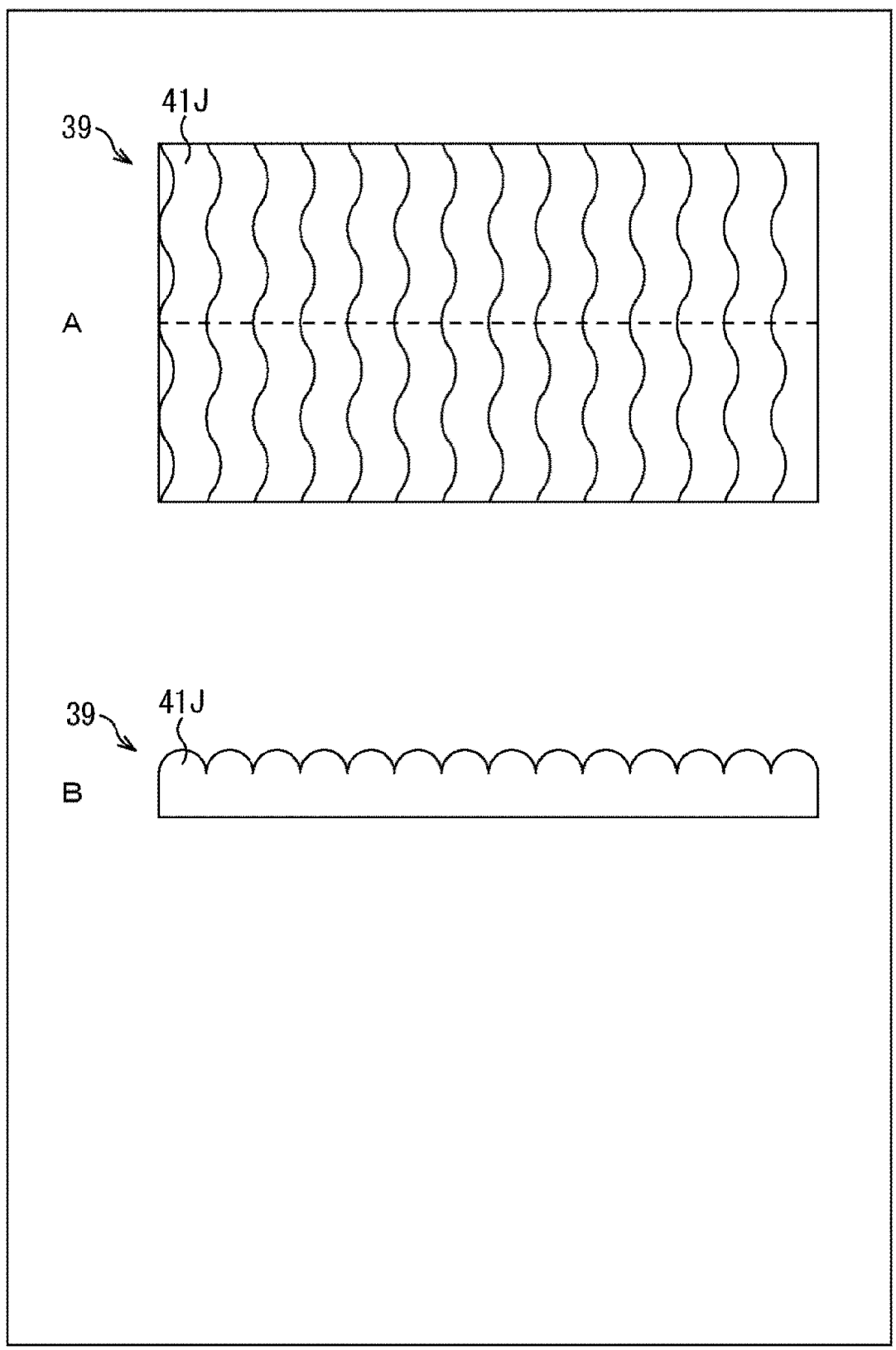
FIG. 28 illustrates an arrangement example of protruding portions formed elongated vertically in a wave-like shape.

FIG. 28 illustrates an arrangement example of protruding portions 41J formed vertically elongated in a wave-like shape in the plan view of the counterbore surface 39. A of FIG. 28 illustrates a structure of the counterbore surface 39 in the plan view. B of FIG. 28 illustrates a first exemplary cross-sectional structure of the counterbore surface 39 taken along a broken line illustrated in A of FIG. 28.

As illustrated in FIG. 28, it may be possible to adopt an arrangement example in which the plurality of protruding portions 41J each having a substantially semicircular cross-sectional shape is formed vertically elongated in a wave-like shape, and is consecutively arranged.

As described above, a reflectance of light reflected at the counterbore surface 39 can be suppressed by appropriately using the protruding portions 41 having various shapes as illustrated in FIGS. 6 to 28.

Note that the above-described imaging elements 12 described are applicable to imaging systems such as a digital still camera and a digital video camera, a mobile phone having an imaging function, or various kinds of electronic apparatuses such as other apparatuses each including an imaging function.

Figure 29:
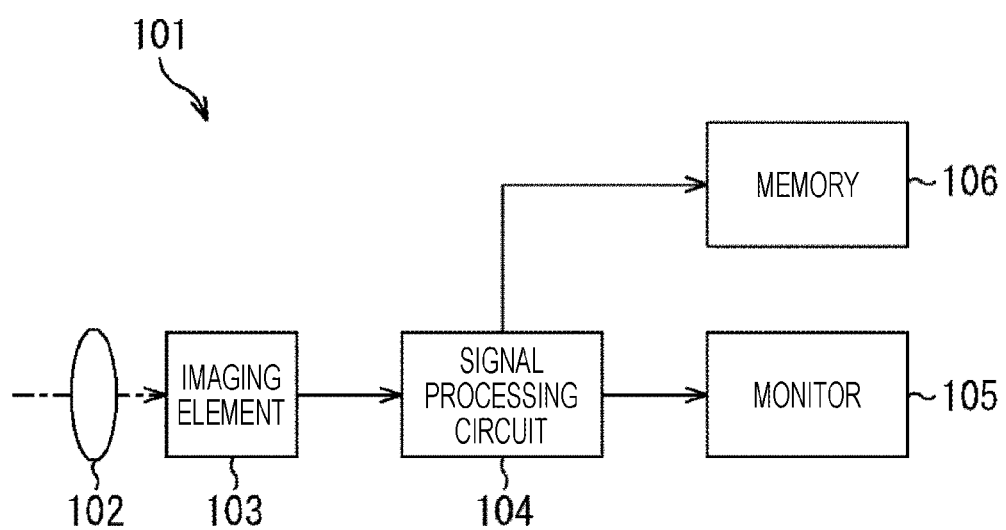
FIG. 29 is a block diagram illustrating an exemplary configuration of an embodiment of the imaging device to which the present technology is applied.

FIG. 29 is a block diagram illustrating an exemplary configuration of an imaging device mounted on an electronic apparatus.

As illustrated in FIG. 29, an imaging device 101 includes an optical system 102, an imaging element 103, a signal processing circuit 104, a monitor 105, and a memory 106, and is capable of capturing a still image and a moving image.

The optical system 102 is constituted of one or a plurality of lenses, and guides light (incident light) from a subject to the imaging element 103, and forms an image on a light receiving surface (sensor portion) of the imaging element 103.

As the imaging element 103, the imaging element 12 described above is applied. In the imaging element 103, electrons are accumulated for a predetermined period in accordance with an image formed on the light receiving surface via the optical system 102. Then, a signal corresponding to the electrons accumulated in the imaging element 103 is supplied to the signal processing circuit 104.

The signal processing circuit 104 applies various kinds of signal processing to a pixel signal output from the imaging element 103. An image (image data) obtained by applying the signal processing by the signal processing circuit 104 is supplied and displayed on the monitor 105 and supplied and stored (recorded) in the memory 106.

In the imaging device 101 thus configured, focusing accuracy on a subject can be improved by applying the above-described imaging element 12, and it is possible to reliably capture an image in focus.

Figure 30:
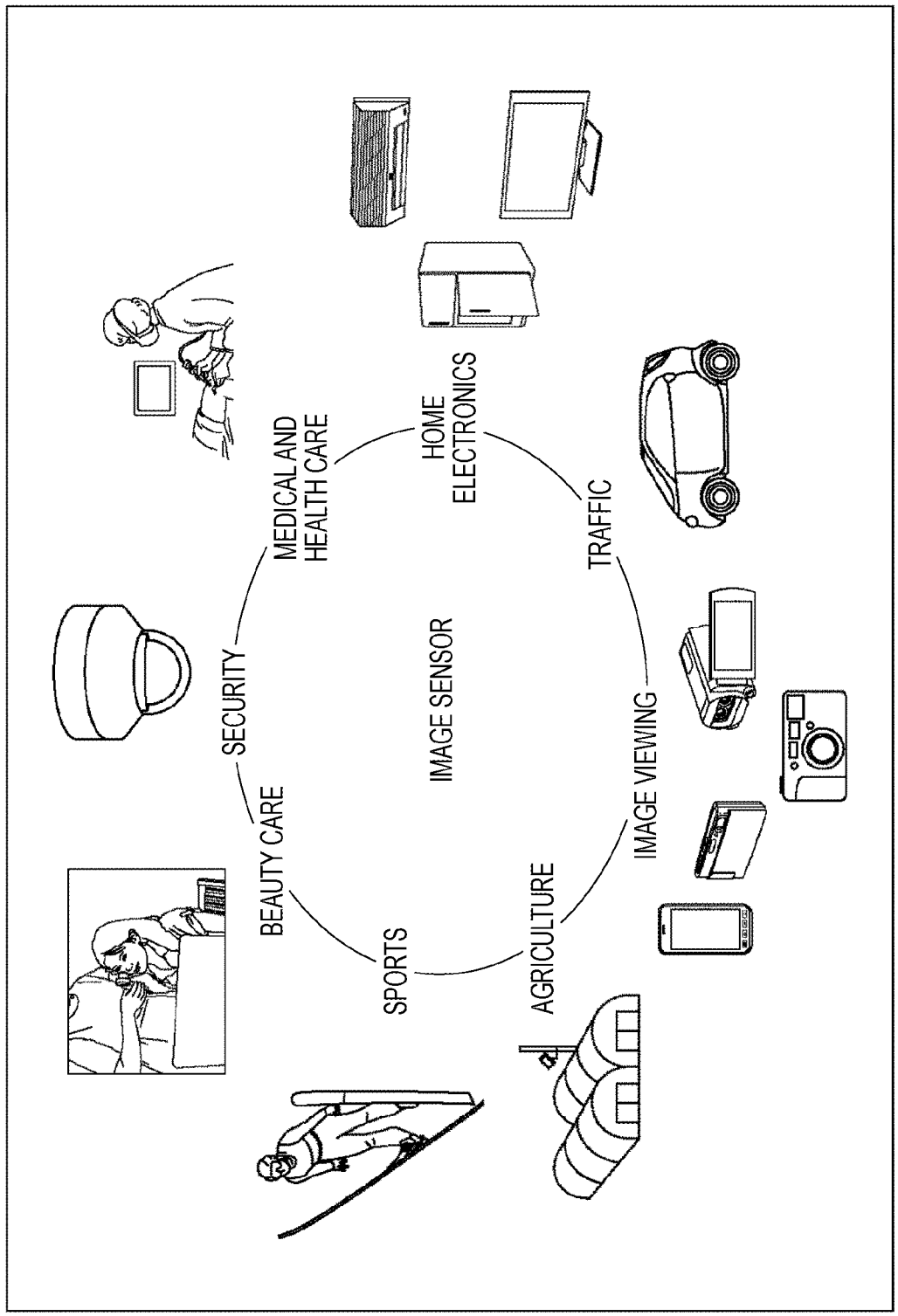
FIG. 30 is a diagram illustrating usage examples using an image sensor.

FIG. 30 is a diagram illustrating usage examples using the above-described image sensor.

For example, the above-described image sensor can be used in various cases of sensing light such as visible light, infrared light, ultraviolet light, and X-rays as described below.

- Device adapted to photograph an image provided for image viewing, such as a digital camera, a portable device incorporated with a camera function
- Device provided for traffic, such as an on-vehicle sensor adapted to photograph a front side, a rear side, a periphery of a vehicle, a car interior, and the like, a monitoring camera adapted to monitor a traveling vehicle and a road, and a ranging sensor adapted to measure an inter-vehicle distance and the like in order to perform safety drive such as automatic stop and also to recognize a driver's condition and the like
- Device provided for home electronics such as a television, a refrigerator, and an air conditioner in order to photograph a user's gesture and operate the electric appliances in accordance with the gesture
- Device provided for medical and health care, such as an endoscope and a device adapted to photograph a blood vessel by receiving infrared light
- Device provided for security, such as a monitoring camera for crime prevention, and a camera for person authentication
- Device provided for beauty care, such as skin measurement instrument adapted to photograph skin, and a microscope adapted to photograph a scalp
- Device provided for sports and the like, such as an action camera and a wearable camera used in sports
- Device provided for agriculture, such as a camera to monitor condition of fields and crops.

Note that the present technology may also adopt the following structures.

(1)

A solid-state imaging element including:

an imaging region where a plurality of pixels is planarly arranged and imaging is performed by receiving incident light;

a connection portion provided on a more outer side than the imaging region is and utilized for connection to an outside;

an open portion that is opened up to the connection portion from a light incident surface side of the imaging region on which light is incident; and a plurality of protruding portions formed on a counterbore surface and periodically arranged, the counterbore surface being a surface inside the open portion excluding the connection portion, and also being a surface facing at least the light incident surface side at a position lower than a layer provided in the imaging region or in a peripheral region of the imaging region and containing an organic substance.

(2)

The solid-state imaging element recited in (1) above, in which the open portion includes: a shallow portion having a shape obtained by shallowly excavating an entire region to be the open portion; and a deep portion having a shape obtained by deeply excavating a region corresponding to the connection portion in a part of the shallow portion, and the protruding portions are formed on the counterbore surface to be a surface of the shallow portion.

(3)

The solid-state imaging element recited in (1) or (2) above, in which a second film having a refractive index that is between a refractive index of a first film and a refractive index of a semiconductor substrate is layered between the first film having the protruding portions formed in the shallow portion and the semiconductor substrate having photodiodes formed in the pixels of the imaging region.

(4)

The solid-state imaging element recited in any one of (1) to (3) above, in which the protruding portions are formed on the counterbore surface inside the open portion at a position lower than an organic film provided in the imaging region.

(5)

The solid-state imaging element recited in any one of (1) to (4) above, in which the protruding portion is formed to have a surface shape to be a spherical surface or an aspheric curved surface.

(6)

The solid-state imaging element recited in any one of (1) to (5) above, in which a lens layer where a lens to condense light is formed for each of the pixels in the imaging region located at a position higher than a surface where the protruding portions are formed.

(7)

A manufacturing method for a solid-state imaging element including:

an imaging region where a plurality of pixels is planarly arranged and imaging is performed by receiving incident light;

a connection portion provided on a more outer side than the imaging region is and utilized for connection to the outside;

an open portion that is opened up to the connection portion from a light incident surface side of the imaging region on which light is incident; and a plurality of protruding portions formed on a counterbore surface and periodically arranged, the counterbore surface being a surface inside the open portion excluding the connection portion, and also being a surface facing at least the light incident surface side at a position lower than a layer provided in the imaging region or in a peripheral region of the imaging region and containing an organic substance, the manufacturing method including:

forming the protruding portions by transferring shapes of lenses by etching, at the time of excavating the open portion, a lens layer where the lenses to condense light are formed for the respective pixels in the imaging region located at a position higher than a surface where the protruding portions are formed.

(8)

An electronic apparatus including a solid-state imaging element including:

an imaging region where a plurality of pixels is planarly arranged and imaging is performed by receiving incident light;

a connection portion provided on a more outer side than the imaging region is and utilized for connection to the outside;

an open portion that is opened up to the connection portion from a light incident surface side of the imaging region on which light is incident; and a plurality of protruding portions formed on a counterbore surface and periodically arranged, the counterbore surface being a surface inside the open portion excluding the connection portion, and also being a surface facing at least the light incident surface side at a position lower than a layer provided in the imaging region or in a peripheral region of the imaging region and containing an organic substance.

Note that the present embodiment is not limited to the above-described embodiment, and various kinds of modifications can be made within a range not departing from the gist of the present disclosure.

REFERENCE SIGNS LIST

11 Solid-state imaging element package
12 Imaging element
13 Interposer substrate
14 Frame
15 Protective glass
16 Pixel
17 Photodiode
18 Filter
19 On-chip lens
21 Imaging region
22 Metal pad
23 Metal pad
24 Bonding wire
25 Wire bonding ball
31 Wiring layer
32 Semiconductor substrate
33 Layered structure film
34 Pad open portion
35 Shallow portion
36 Deep portion
39 Counterbore surface
40 Flat surface
41 Protruding portion
42 Lens

What is claimed is:

1. A solid-state imaging element comprising:
an imaging region where a plurality of pixels is planarly arranged and imaging is performed by receiving incident light;
a connection portion provided on a more outer side than the imaging region is and utilized for connection to the outside;
an open portion that is opened up to the connection portion from a light incident surface side of the imaging region on which light is incident; and
a plurality of protruding portions formed on a counterbore surface and periodically arranged, the counterbore surface being a surface inside the open portion excluding the connection portion, and also being a surface facing at least the light incident surface side at a position lower than a layer provided in the imaging region or in a peripheral region of the imaging region and containing an organic substance.

2. The solid-state imaging element according to claim 1, wherein
the open portion includes: a shallow portion having a shape obtained by shallowly excavating an entire region to be the open portion; and a deep portion having a shape obtained by deeply excavating a region corresponding to the connection portion in a part of the shallow portion, and
the protruding portions are formed on the counterbore surface to be a surface of the shallow portion.

3. The solid-state imaging element according to claim 2, wherein a second film having a refractive index that is between a refractive index of a first film and a refractive index of a semiconductor substrate is layered between the first film having the protruding portions formed in the shallow portion and the semiconductor substrate having photodiodes formed in the pixels of the imaging region.

4. The solid-state imaging element according to claim 1, wherein the protruding portions are formed on the counterbore surface inside the open portion at a position lower than an organic film provided in the imaging region.

5. The solid-state imaging element according to claim 1, wherein the protruding portion is formed to have a surface shape to be a spherical surface or an aspheric curved surface.

6. The solid-state imaging element according to claim 1, wherein a lens layer where a lens that condenses light is formed for each of the pixels in the imaging region located at a position higher than the counterbore surface where the protruding portions are formed.

7. A manufacturing method for a solid-state imaging element including:
an imaging region where a plurality of pixels is planarly arranged and imaging is performed by receiving incident light;
a connection portion provided on a more outer side than the imaging region is and utilized for connection to the outside;
an open portion that is opened up to the connection portion from a light incident surface side of the imaging region on which light is incident; and
a plurality of protruding portions formed on a counterbore surface and periodically arranged, the counterbore surface being a surface inside the open portion excluding the connection portion, and also being a surface facing at least the light incident surface side at a position lower than a layer provided in the imaging region or in a peripheral region of the imaging region and containing an organic substance,
the manufacturing method comprising:
forming the protruding portions by transferring shapes of lenses by etching, at a time of excavating the open portion, a lens layer where the lenses to condense light are formed for the respective pixels in the imaging region located at a position higher than a surface where the protruding portions are formed.

8. An electronic apparatus comprising a solid-state imaging element including:
an imaging region where a plurality of pixels is planarly arranged and imaging is performed by receiving incident light;
a connection portion provided on a more outer side than the imaging region is and utilized for connection to an outside;

an open portion that is opened up to the connection portion from a light incident surface side of the imaging region on which light is incident; and a plurality of protruding portions formed on a counterbore surface and periodically arranged, the counterbore surface being a surface inside the open portion excluding the connection portion, and also being a surface facing at least the light incident surface side at a position lower than a layer provided in the imaging region or in a peripheral region of the imaging region and containing an organic substance.

\* \* \* \* \*